(12) United States Patent
Salman et al.

(10) Patent No.: US 10,700,055 B2
(45) Date of Patent: Jun. 30, 2020

(54) BACK BALLASTED VERTICAL NPN TRANSISTOR

(71) Applicant: Texas Instruments Incorporated, Dallas, TX (US)

(72) Inventors: Akram Ali Salman, Plano, TX (US); Guruvayurappan Mathur, Plano, TX (US); Ryo Tsukahara, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 15/838,876

(22) Filed: Dec. 12, 2017

(65) Prior Publication Data

US 2019/0181134 A1 Jun. 13, 2019

(51) Int. Cl.
| | | |
|---|---|---|
| *H01L 27/02* | (2006.01) | |
| *H01L 27/06* | (2006.01) | |
| *H01L 29/08* | (2006.01) | |
| *H01L 29/66* | (2006.01) | |
| *H01L 29/73* | (2006.01) | |
| *H01L 29/06* | (2006.01) | |

(52) U.S. Cl.
CPC ...... *H01L 27/0262* (2013.01); *H01L 27/0259* (2013.01); *H01L 27/0623* (2013.01); *H01L 29/0646* (2013.01); *H01L 29/0804* (2013.01); *H01L 29/0821* (2013.01); *H01L 29/66234* (2013.01); *H01L 29/66287* (2013.01); *H01L 29/7302* (2013.01); *H01L 29/7304* (2013.01)

(58) Field of Classification Search
CPC ............. H01L 27/0262; H01L 27/0623; H01L 27/259; H01L 27/66234; H01L 29/0821; H01L 29/73; H01L 29/7302; H01L 29/7304; H01L 29/732; H01L 29/7322; H01L 29/7325; H01L 29/735
See application file for complete search history.

(56) References Cited

U.S. PATENT DOCUMENTS

| | | | |
|---|---|---|---|
| 9,006,833 | B2 | 4/2015 | Edwards et al. |
| 9,153,569 | B1 | 10/2015 | Edwards et al. |
| 9,224,724 | B2 | 12/2015 | Salman et al. |
| 9,633,991 | B2 | 4/2017 | Salman et al. |
| 2013/0264640 | A1 | 10/2013 | Salman et al. |
| 2013/0285113 | A1 | 10/2013 | Edwards et al. |
| 2013/0320396 | A1 | 12/2013 | Salman et al. |
| 2014/0124828 | A1 | 5/2014 | Salman et al. |
| 2015/0085409 | A1 | 3/2015 | Ali et al. |

(Continued)

*Primary Examiner* — David C Spalla
(74) *Attorney, Agent, or Firm* — Andrew R. Ralston; Charles A. Brill; Frank D. Cimino

(57) ABSTRACT

Disclosed examples provide fabrications methods and integrated circuits with back ballasted NPN bipolar transistors which include an n-type emitter in a P doped region, a p-type base with a first side facing the emitter, and an n-type collector laterally spaced from a second side of the base, where the collector includes a first side facing the second side of the base, an opposite second side, a silicided first collector portion and a silicide blocked second collector portion covered with a non-conductive dielectric that extends laterally between the first collector portion and the second side of the collector to provide back side ballasting for lateral breakdown and low current conduction via a deep N doped region while the vertical NPN turns on at a high voltage.

20 Claims, 20 Drawing Sheets

(56) References Cited

U.S. PATENT DOCUMENTS

| | | | |
|---|---|---|---|
| 2015/0097265 A1* | 4/2015 | Lin | H01L 29/735 257/526 |
| 2015/0187752 A1 | 7/2015 | Salman et al. | |
| 2015/0243770 A1* | 8/2015 | Hebert | H01L 29/732 257/586 |
| 2015/0270253 A1 | 9/2015 | Fabriz et al. | |
| 2015/0270256 A1 | 9/2015 | Edwards et al. | |
| 2015/0270257 A1 | 9/2015 | Edwards et al. | |
| 2015/0270708 A1 | 9/2015 | Edwards et al. | |
| 2015/0294967 A1 | 10/2015 | Salman et al. | |
| 2015/0340357 A1 | 11/2015 | Edwards et al. | |
| 2015/0340358 A1 | 11/2015 | Edwards et al. | |
| 2015/0371985 A1 | 12/2015 | Edwards et al. | |
| 2016/0079227 A1 | 3/2016 | Edwards et al. | |
| 2016/0079750 A1 | 3/2016 | Edwards et al. | |
| 2016/0141363 A1* | 5/2016 | Lavrovskaya | H01L 21/8249 257/378 |
| 2016/0156176 A1 | 6/2016 | Kunz, Jr. et al. | |
| 2016/0224716 A1 | 8/2016 | Fabriz et al. | |
| 2016/0233668 A1 | 8/2016 | Dai et al. | |
| 2016/0300831 A1 | 10/2016 | Salman et al. | |
| 2017/0098643 A1 | 4/2017 | Xiu et al. | |

\* cited by examiner

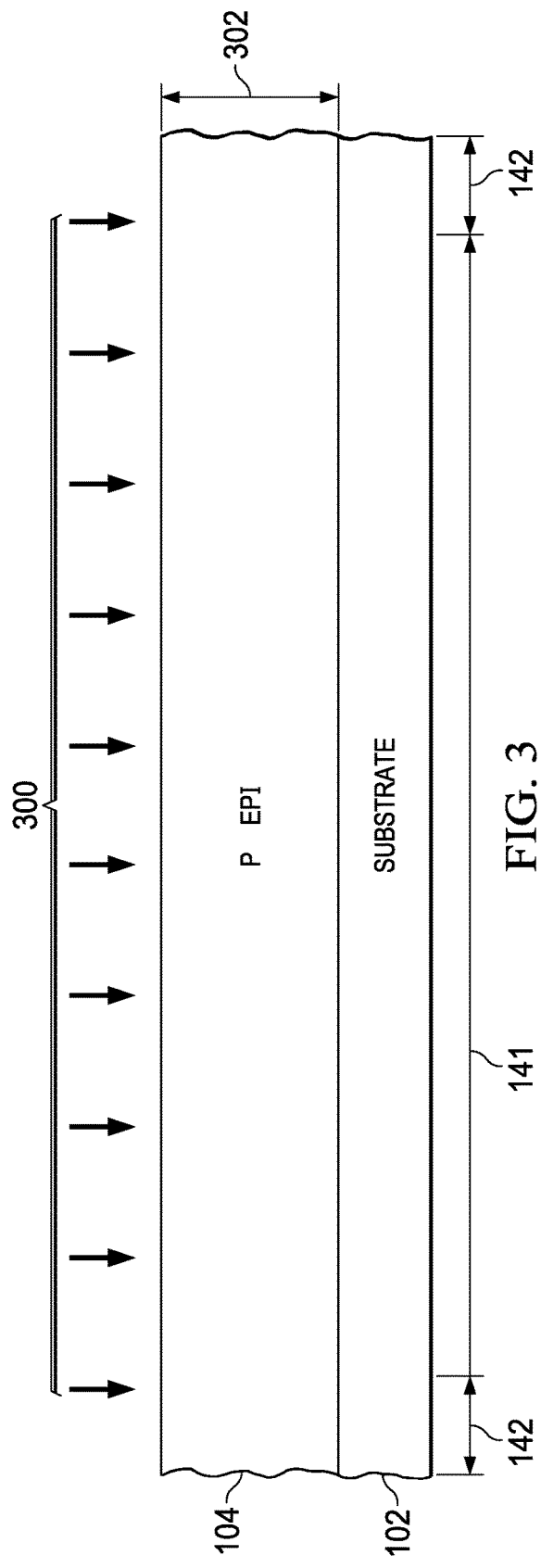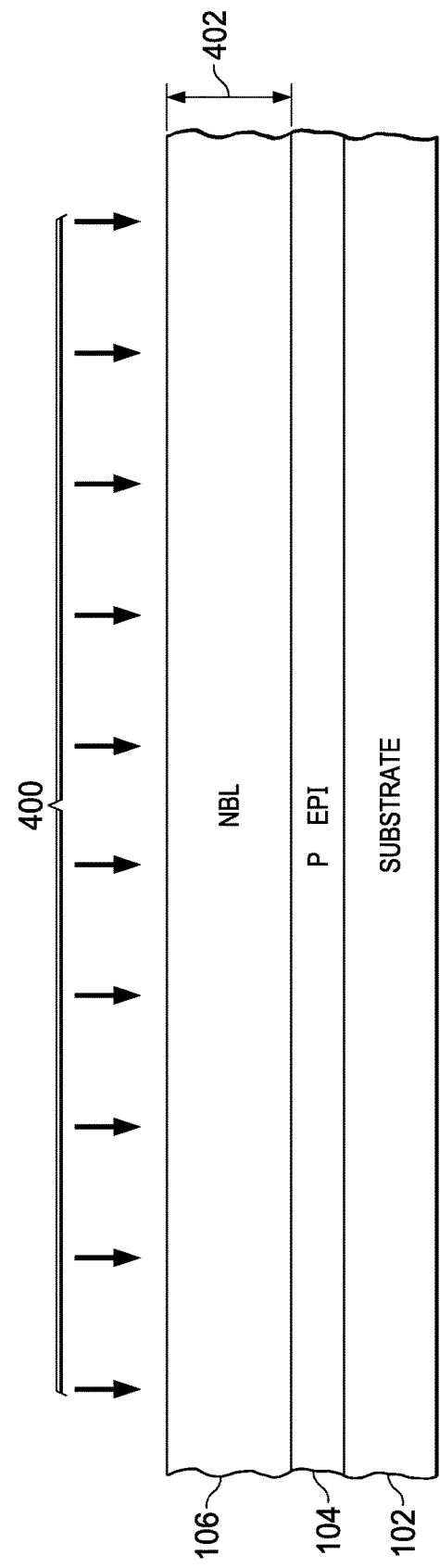

BACK BALLASTED VERTICAL NPN TRANSISTOR

BACKGROUND

Bipolar transistors are used as electrostatic discharge (ESD) protection devices for discharging a protected node in an integrated circuit during an ESD event. Vertical NPN bipolar transistors are sometimes used as protection devices in mixed signal or digital circuits to provide a desired voltage breakdown level using fabrication processes tailored for low voltage CMOS transistors. However, vertical NPN transistors suffer from competing lateral and vertical p-n junction breakdown behavior, which can lead to non-uniformity in current conduction manifested in longer pulses and more prominent ESD stress to a protected node. Islanded internally stacked NPN ESD protection devices include two or more series connected vertical transistors which can be used to provide enhanced control of breakdown voltage characteristics, but these devices occupy significant circuit board area compared to single NPN structures.

SUMMARY

Disclosed examples include fabrications methods and integrated circuits with back ballasted NPN bipolar transistors which include an n-type emitter in a P doped region that has laterally spaced first and second sides, a p-type base with a first side facing the emitter, and an n-type collector laterally spaced from the second side of the base. The collector includes a first side facing the second side of the base, an opposite second side, a silicided first collector portion and a silicide blocked second collector portion covered with a non-conductive dielectric that extends laterally between the first collector portion and the second side of the collector. The silicide blocked second collector portion in certain examples provides back side ballasting for lateral breakdown and low current conduction via a deep N doped region, while the vertical NPN turns on at a high voltage. Disclosed examples provide vertical NPN transistor designs with compact back ballasting away from base to facilitate uniform conduction for vertical NPN transistors in ESD protection and other applications. Certain examples provide front and back dual ballasting to facilitate both improved lateral and vertical conduction. Further examples provide integrated circuits with back ballasted NPN transistors and methods for fabricating integrated circuits.

BRIEF DESCRIPTION OF THE DRAWINGS

FIGS. 3-18 are partial sectional side elevation views showing the integrated circuit of FIG. 1 at successive fabrication steps according to the method of FIG. 2.

DETAILED DESCRIPTION

Figure 1:
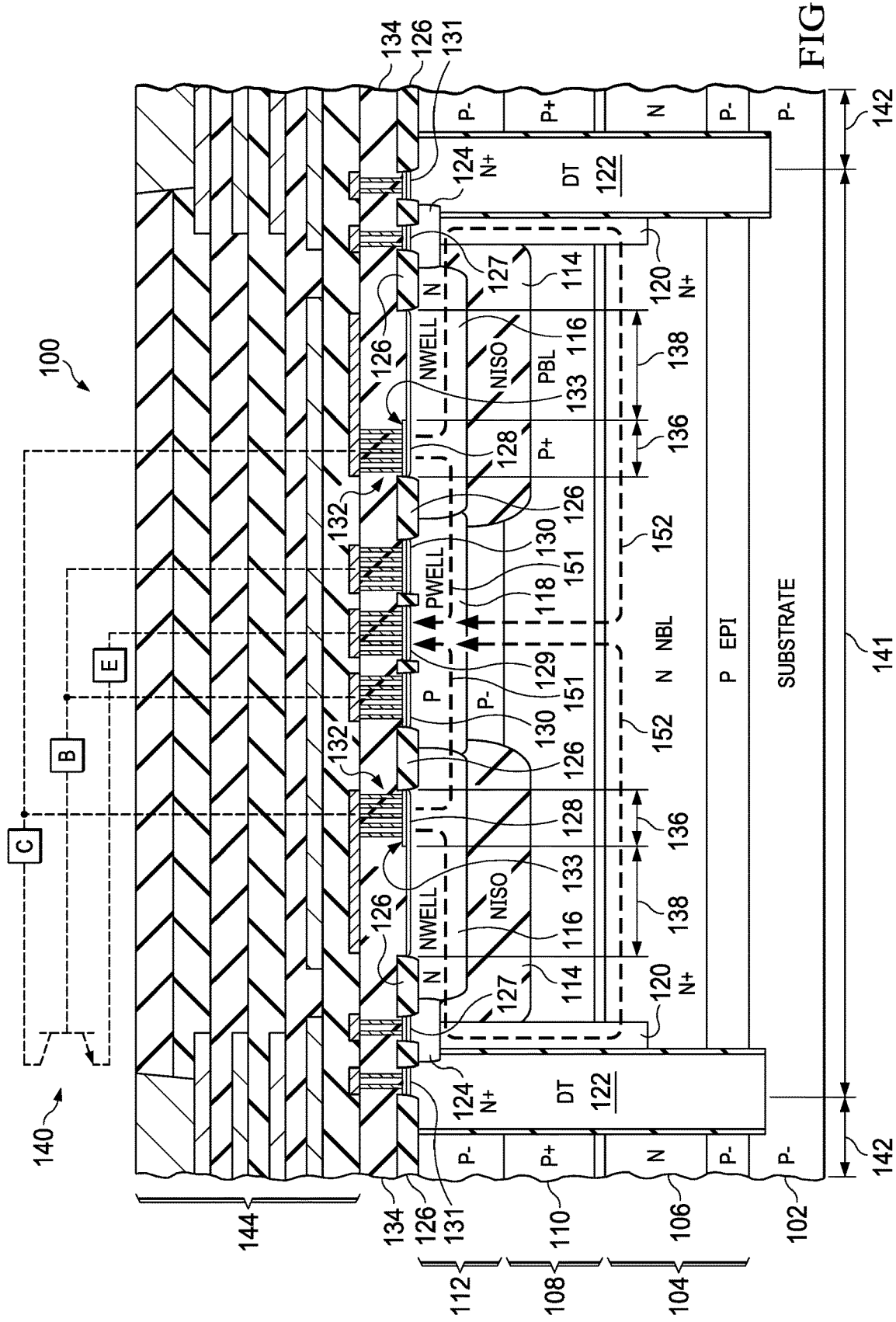
FIG. 1 is a partial sectional side elevation view of an integrated circuit with a back ballasted vertical NPN bipolar transistor ESD protection circuit according to one embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". Disclosed examples facilitate harmonized complementary operation of the lateral and vertical junctions of a vertical NPN transistor to provide tighter control of breakdown voltage, snap-back voltage and other protection device operating characteristics, without the circuit board area penalties associated with internally stacked island NPN transistors. In certain examples, the vertical and lateral p-n junctions do not compete, but instead complement each other to provide protection conduction that begins laterally and transitions to vertical conduction while maintaining uniform operation with consistent holding voltage. Disclosed examples also provide significant space savings compared to internally stacked NPN devices.

FIG. 1 shows an integrated circuit (IC) 100 with a back ballasted vertical NPN bipolar transistor 140 according to one embodiment. The IC 100 includes a semiconductor structure with a p-type semiconductor substrate 102. In some implementations, a single or multi-layer epitaxial silicon structure is formed on the substrate 102. In the example of FIG. 1, a multi-layer p-type epitaxial silicon structure 104, 108, 112 is formed on the substrate 102. The semiconductor structure in this example is segregated into laterally spaced first and second regions 141 and 142, referred to hereinafter as substrate regions. In this example, the transistor 140 is formed in the first substrate region 141, and other circuit components (not shown) are fabricated in the second region 142. The substrate regions 141 and 142 are separated in this example by a deep trench isolation structure 122. In the example of FIG. 1, the transistor 140 is formed as an elongated structure that extends along a direction in and out of the page in FIG. 1, and the deep trench structure extends around the first region 141. This example NPN bipolar transistor structure includes a central emitter E encircled by a surrounding base B and an outer surrounding collector C, and the transistor is schematically shown dashed line for in FIG. 1 for reference.

Any suitable substrate structure 102 can be used, for example, a p-type silicon wafer, a p-type silicon-on-insulator (SOI) substrate, or a substrate that includes a different semiconductor material. The substrate 102 includes p-type silicon. A p-type epitaxial silicon multi-layer structure 104, 108, 112 is positioned over the substrate 102. The example epitaxial silicon structure in FIG. 1 includes a p-type first epitaxial layer 104 formed above the semiconductor substrate 102. The first epitaxial layer in one example is formed to a thickness 107 of approximately 17 μm and includes boron or other P type impurities at a dopant concentration of 1E15 $cm^{-3}$, although not a strict requirement of all embodiments. The first epitaxial layer 104 is implanted with n-type impurities to be covered or buried by subsequently formed layers. The implanted n-type impurities form an N doped layer 106, for example, an N buried layer (NBL) positioned in an upper portion of the first epitaxial layer 104. In one example, the N doped layer 106 is implanted with n-type impurities, such as phosphorus, having a dopant concentration in the range of 1E18 to 1E19 $cm^{-3}$, although other concentrations may be used.

The epitaxial silicon structure also includes a p-type second epitaxial layer 108 formed above the first epitaxial layer 104 to a thickness 111 of approximately 7.3 µm. The second epitaxial layer 108 in one example is epitaxially grown silicon, lightly doped with p-type impurities (e.g., boron) with a dopant concentration of approximately 1E15 $cm^{-3}$, although other concentrations may be used. The second epitaxial layer 108 is implanted with p-type impurities to be covered or buried by subsequently formed layers. The implanted p-type impurities form a P doped layer, for example, a P buried layer (PBL) 110 positioned above the N doped layer 106 in an upper portion of the second epitaxial layer 108. The P doped layer 110 can be of any suitable depth extending at least partially into the second epitaxial layer 108. In one example, the P doped layer 110 is implanted with boron or other p-type dopants to a concentration in the range of 5E16 to 5E17 $cm^{-3}$, although other concentrations may be used. The epitaxial silicon structure in this example also includes a p-type third epitaxial layer 112 formed above the second epitaxial layer 108 that provides an upper surface for the semiconductor structure. The third epitaxial layer 112 in one example is formed above the second epitaxial layer 108 to a thickness 113 of approximately 6.6 µm. The third epitaxial layer 112 in this example is doped with p-type impurities, for example, boron with a dopant concentration of approximately 1E15 $cm^{-3}$, although other concentrations may be used.

As used herein, the first and second substrate regions 141 and 142 include the laterally spaced portions of the substrate 102, the epitaxial structure 104, 108, 112, and structures formed therein and above a top surface of the semiconductor structure. In the illustrated example, the NPN bipolar transistor 140 is formed in the first substrate region 141, meaning at least partially on, above and/or in the lateral portion 141 of the substrate 102 and the epitaxial layers 104, 108 and 112. The NPN transistor 140 in certain examples includes a number of parallel connected segments formed in the first substrate region 141, which collectively constitute a single NPN transistor. In other implementations, no segmentation is used and the transistor 140 is formed by a single emitter, a single collector, and a single base.

The IC 100 in FIG. 1 also includes an N doped region 116 and a P doped region 118 positioned in an upper portion of the epitaxial silicon structure (e.g., in the upper portion of the third epitaxial layer 112). In the illustrated example, the P doped region 118 is generally centrally located and the N doped region 116 encircles the P doped region 118, although not a strict requirement of all possible implementations. The N doped region 116 includes a first side and a second side which are laterally spaced from one another. In one example, the N doped region 116 is implanted with phosphorus or other n-type impurities to a dopant concentration in the range of 8E16 to 2E17 $cm^{-3}$, although other concentrations may be used. The N doped region 116 and the transistor collector C are connected to a protected node (not shown) via metallization structures 144 formed above the top of the third epitaxial layer 112. The P doped region 118 also includes lateral first and second sides, with a second side along the first side of the N doped region 116. The transistor base B is formed by the P doped region 118 in the p-type third epitaxial layer 112 near the N doped region 116. In one example, the P doped region 118 is implanted with boron or other p-type dopants to a dopant concentration in the range of 8E16 to 2E17 $cm^{-3}$, although other concentrations may be used.

The IC 100 further includes a deep N doped region 120 which is electrically connected to the second side of the N doped region 116. The deep N doped region 120 extends from the upper portion of the epitaxial silicon structure 104, 108, 112 downward through the P doped layer 110 and into the N doped layer 106. In certain embodiments, the deep N doped region 120 is formed to laterally encircle the first region 141 in FIG. 1. In certain examples, the deep N doped region 120 is implanted with phosphorus or other n-type dopants to a concentration of 1E17-1E18 $cm^{-3}$, although other concentrations may be used. In addition, the IC 100 includes an n-type isolation region (NISO) 114 positioned under the N doped region 116 and partially into an upper portion of the P doped layer 110. In the illustrated example, the isolation region 114 is a ring structure that extends around the central emitter. The isolation region 114 includes a side that extends along an upper portion of the deep N doped region 120.

The IC 100 further includes a deep trench (DT) structure 122 that extends around the lateral sides of the transistor structure and forms a later boundary between the first and second substrate regions 141 and 142. The deep trench structure 122 includes p-type polysilicon material laterally bounded by an oxide sidewall, and extends vertically between the upper portion of the third epitaxial silicon layer 112, downward through the P doped layer 110 and the N doped layer 106, and into the substrate 102. The deep trench structure 122 in FIG. 1 includes silicon dioxide ($SiO^2$) or other oxide material sidewalls and the trench 122 is filled with p-type polysilicon.

The deep N doped region 120 extends from the upper portion of the third epitaxial silicon layer 112 downward through the P doped layer 110 and into the N doped layer 106 along the oxide sidewall of the deep trench structure 122. The IC 100 also includes a heavily doped n-type region 124 that extends in the upper portion of the third epitaxial silicon layer 112 between the N doped region 116 and the deep N doped region 120. Isolation structures 126 are formed in and above select portions of the upper surface of the third epitaxial layer 112 to provide electrical isolation between various structures of the transistor 140, and silicide contacts are formed between intervening isolation structures. The isolation structures 126 can be any suitable material, such as shallow trench isolation (STI) or field oxide (FOX) structures.

The NPN bipolar transistor 140 includes a heavily doped n-type emitter 129 (E) positioned in an upper portion of the P doped region 118, as doped region as a heavily doped p-type base 130 laterally spaced from the emitter 129 in the upper portion of the P doped region 118 between the emitter 129 and the second side of the P doped region 118. The base 130 includes a first side facing the emitter 129 and an opposite second side. The transistor 140 also includes a heavily doped n-type collector 128 that is positioned to provide back side ballasting according to various aspects of the present disclosure. The collector 128 in one example is a heavily doped n-type region which is laterally spaced from the second side of the base 130 in an upper portion of the N doped region 116. The collector 128 includes a first side facing the second side of the base 130 and an opposite second side. In this example, the collector 128 provides two lateral portions, including a first collector portion 136 nearest to the base 129, and a second collector portion 138 that extends laterally between the first collector portion 136 and the second side of the collector 128. The structure further includes a conductive silicide collector contact 133 positioned on an upper surface of the first collector portion 136. The silicide collector contact 133 is spaced from the second side of the collector 128, and a non-conductive dielectric 134 is formed on an upper surface of the second collector portion 138.

As shown in FIG. 1, the IC 100 also includes an upper metallization structure 144 which can be a single or multiple layer configuration in various different implementations. In the illustrated example, the metallization structure 144 is formed over an initial dielectric/contact layer, including a pre-metal dielectric (PMD) layer 134 positioned over the upper surface of the third epitaxial silicon layer 112 and over the isolation structures 126. Conductive metal contacts 132 (e.g., tungsten W) are formed through select portions of the PMD dielectric layer 134 in order to make electrical contact between conductive structures of the metallization structure 144 and various terminals of the fabricated NPN transistor. In particular, collector contacts are made by formation of conductive contacts 132 through the PMD layer 134 to the conductive silicide collector contact 133 on the upper side of the first collector portion 136 nearest to the base 129. The illustrated example also includes heavily doped n-type regions 127 and associated silicide and tungsten contacts at the tops of the n-type region 124, as well as heavily doped p-type regions 131 and associated silicide and tungsten contacts at the tops of the deep trench structures 122. The silicide blocked second collector portion 138 in this example provides back side ballasting for lateral breakdown to conduct current from the collector through the N doped region 116 and the P doped region 118 to the emitter along a first path 151. At higher voltages, the vertical NPN turns on to conduct current from the collector through the N doped region 116, the deep N doped region 120, the N buried layer 106 and the P doped regions 110, 112 and 118 to the emitter along a second path 152.

Referring now to FIGS. 2-18, FIG. 2 illustrates an example method 200 to fabricate an integrated circuit according to another embodiment, and FIGS. 3-18 show the IC 100 of FIG. 1 at different stages of fabrication according to the method 200. The method 200 in FIG. 2 begins at 201, including providing a p-type semiconductor substrate, for example, the p-type silicon substrate 102 and the overlying p-type epitaxial silicon layer 106 with a top surface and laterally spaced first and second substrate regions 141 and 142 in the example of FIG. 3. In one example, a p-type silicon wafer substrate 102 is provided at 201. In another example, a silicon-on-insulator (SOI) starting wafer is used. A substrate of a different semiconductor material can be provided at 201 in other implementations.

At 202, a first epitaxial layer 104 is formed on or over the p-type silicon substrate 102 using an epitaxial growth deposition process 300 to a depth 302. At 204 in FIG. 2, the upper portion of the first epitaxial layer 104 is implanted with n-type dopants or impurities (e.g., phosphorus) to form the N doped layer 106 in the first epitaxial layer 104. As shown in FIG. 4, an implantation process 400 is performed, which forms the N doped layer 106 to a depth of 402 in the upper portion of the first epitaxial layer 104. The N doped layer 106 is implanted using the process 400 in one example with phosphorus to achieve a dopant concentration in the range of 1E18 to 1E19 cm$^{-3}$.

Figure 2:
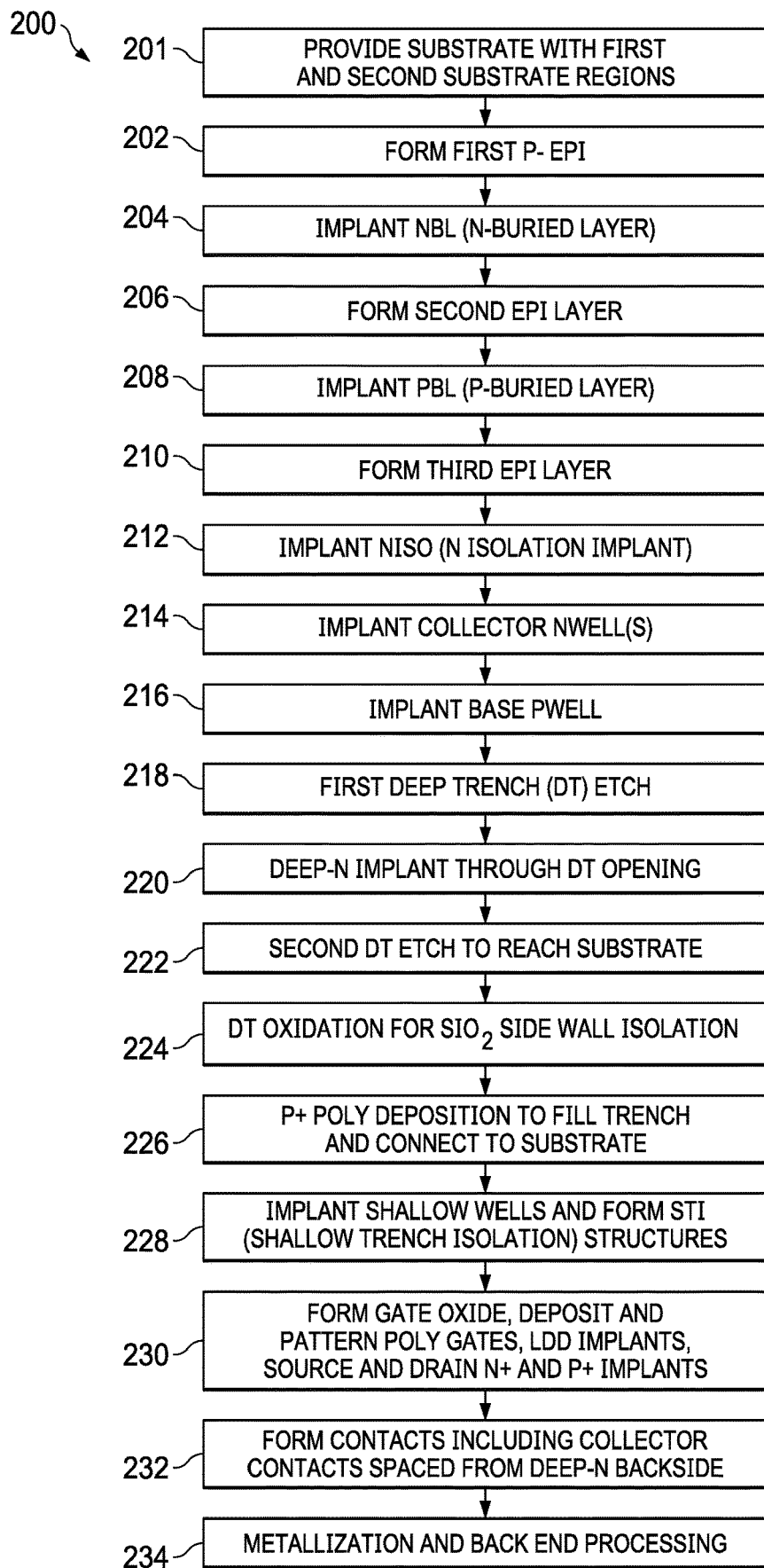
FIG. 2 is a flow diagram showing an example method to fabricate an integrated circuit according to another embodiment.
Figure 5:
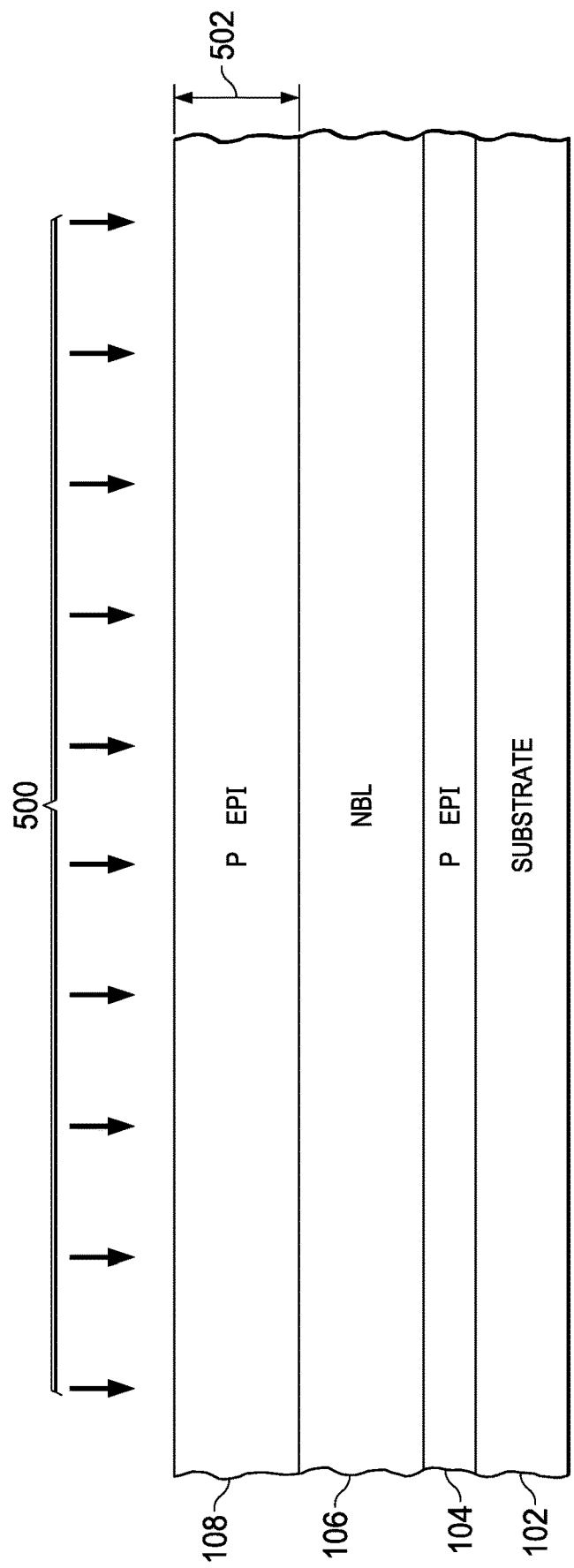
Figure 6:
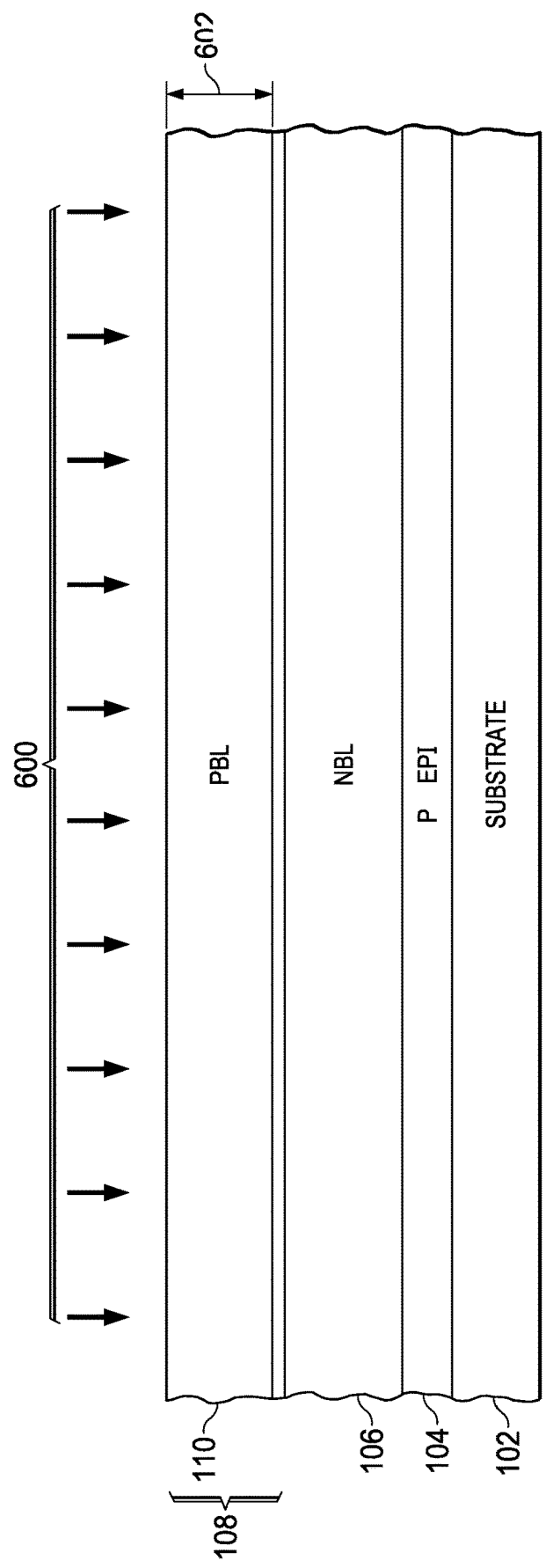
Figure 7:
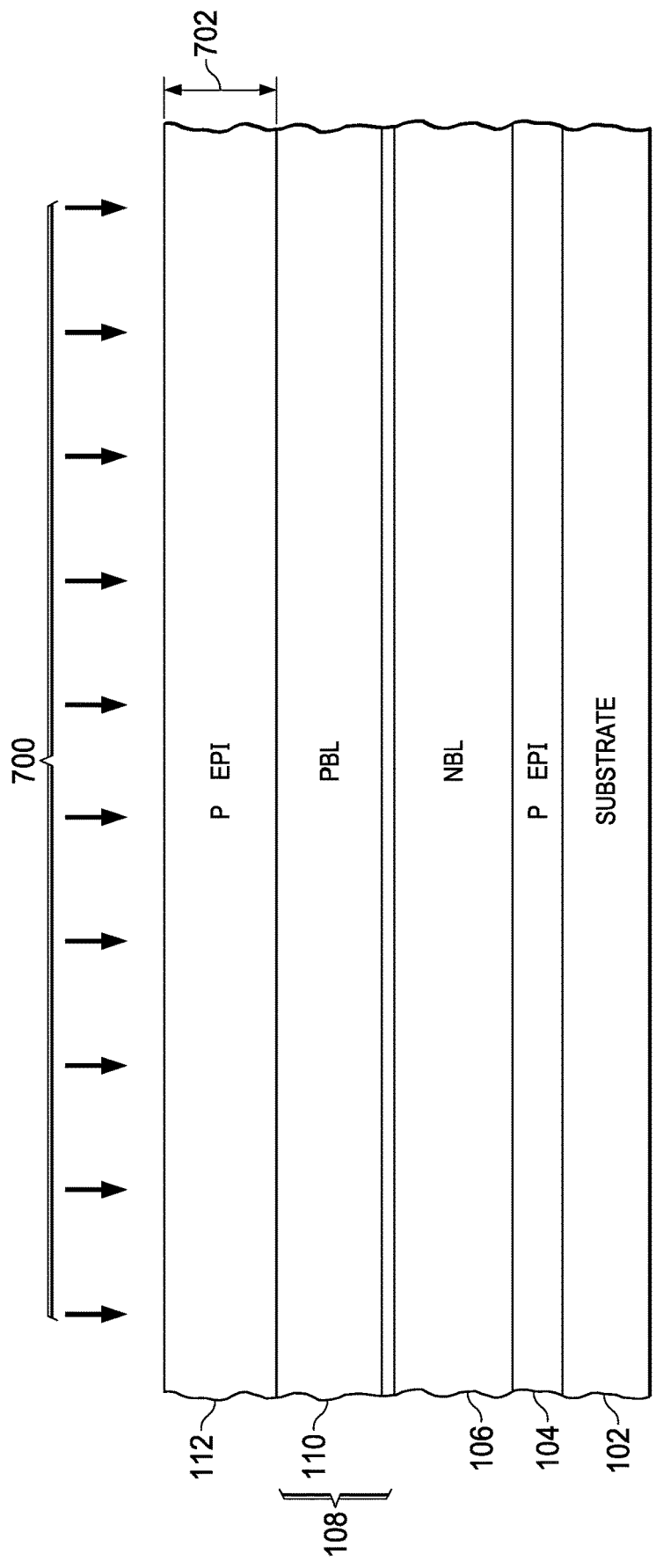

A p-type second epitaxial layer 108 is formed at 206 in FIG. 2 over the first epitaxial layer 104, which may be referred to as a "top-off" epi. FIG. 5 shows an example in which an epitaxial growth process 500 is performed to create the second epitaxial layer 108 to a thickness 502. In this example, the second epitaxial layer 108 is p-type epitaxial silicon formed to a thickness 502 of approximately 7.3 µm, lightly doped with P type impurities (e.g., boron) to a dopant concentration of approximately 1E15 cm$-3$. At 208 in FIG. 2, a P buried layer is implanted in the second epitaxial layer 108, for example, using an implantation process 600 shown in FIG. 6 to form the P doped layer 110 to a thickness 602 in an upper portion of the second epitaxial layer 108. In one example, the P buried layer 110 is implanted with boron or other p-type dopants to a concentration in the range of 5E16 to 5E17 cm$^{-3}$. At 210 in FIG. 2, a third epitaxial layer (e.g., layer 112 in FIG. 7) is formed over the second epitaxial layer 108 to a thickness 702, for example, approximately 6.6 µm. FIG. 7 illustrates an epitaxial growth process 700 to form the third epitaxial layer 112 over the P doped layer 110.

Figure 8:
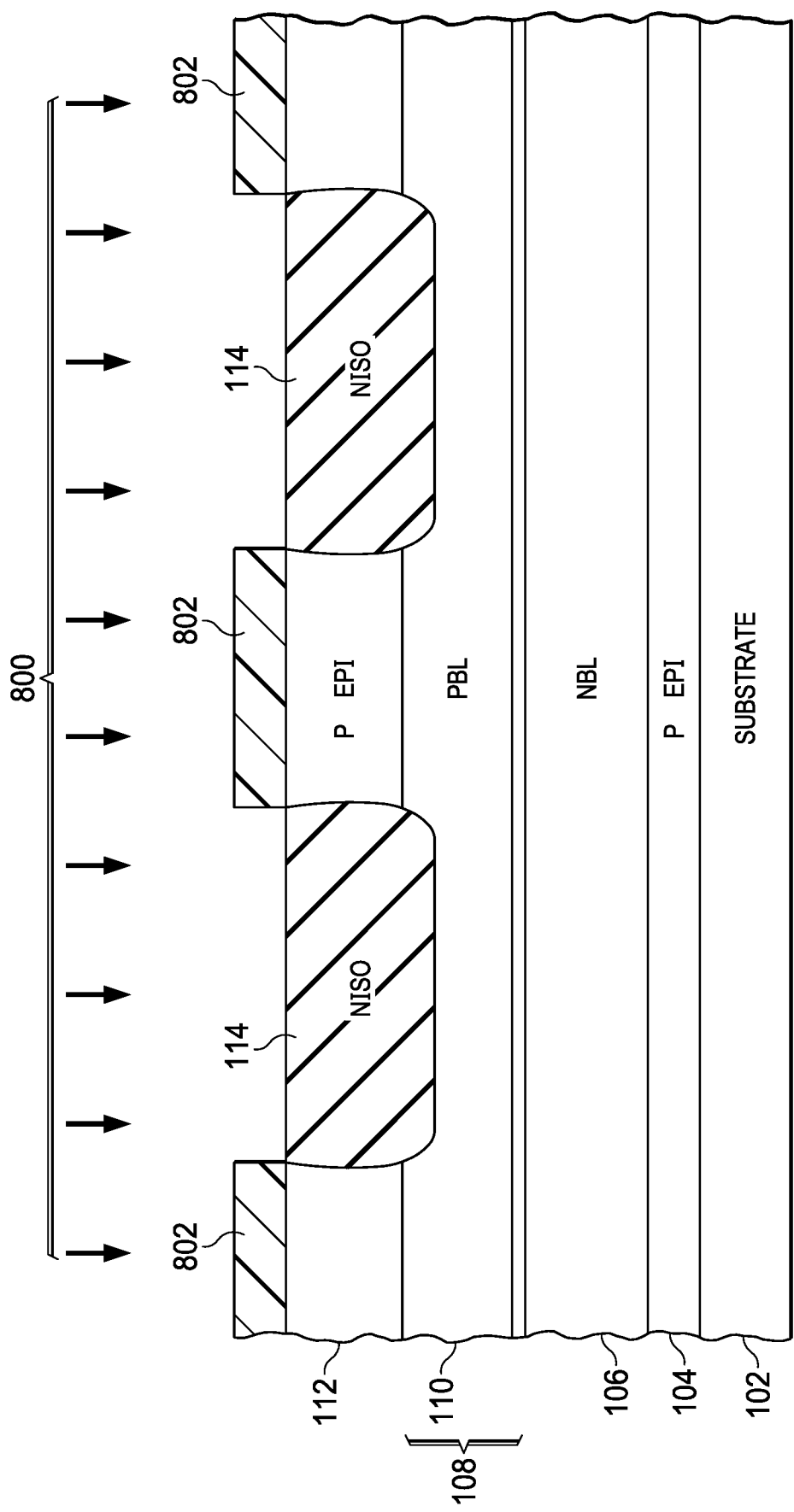
Figure 9:
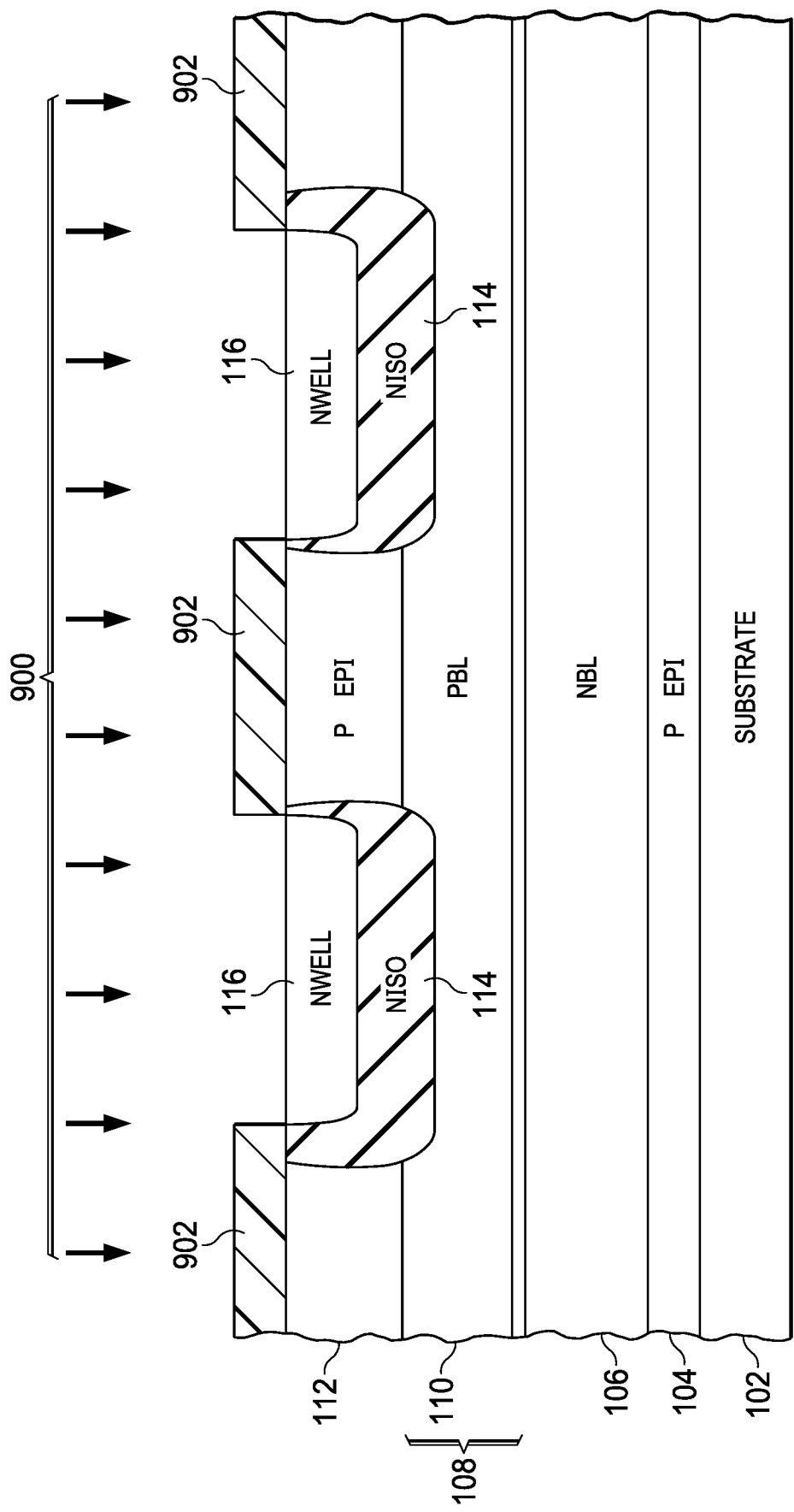
Figure 10:
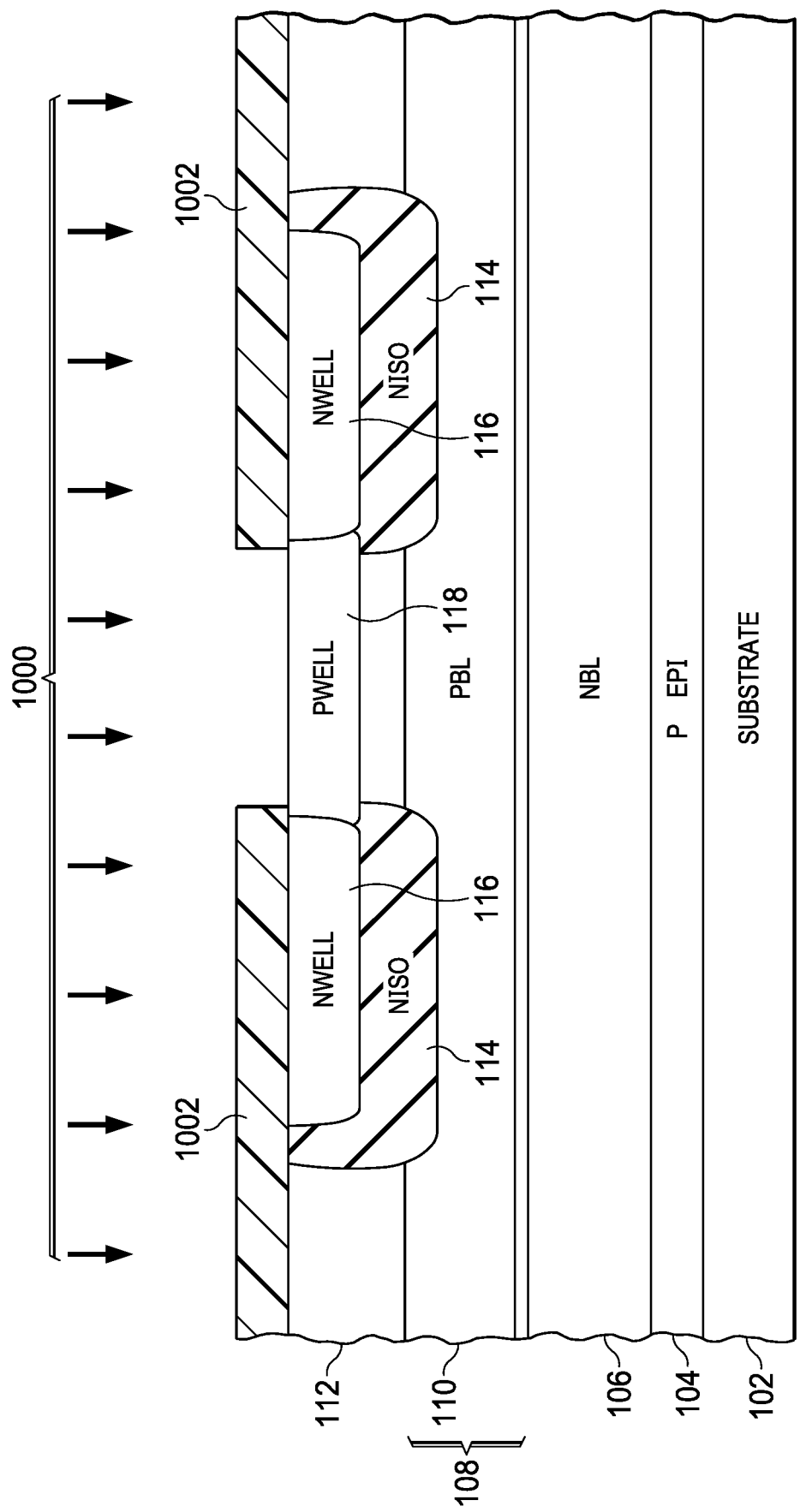

At 212 an n-type isolation region 114 is formed by implanting phosphorus or other n-type dopants into an upper portion of the P doped layer 110. FIG. 8 shows an example in which an implantation process 800 is performed using a mask 802 to form the NISO isolation region 114 in the upper portion of the P doped layer 110. At 214, n-type dopants are implanted into an upper portion of the isolation region 114 to form an N doped region 116 which includes a first side and a second side. FIG. 9 shows an example in which an implantation process 900 is performed using a mask 902 in order to form the N doped region 116 in an upper portion of the isolation region 114. At 216 in FIG. 2, p-type dopants (e.g., boron) are implanted into an upper portion of the third epitaxial layer 112 to form a P doped region 118 which includes a first side, and a second side along the first side of the N doped region 116. FIG. 10 shows one example using an implantation process 1000 and a mask 1002, which implants p-type dopants to form the P doped region 118 in an upper portion of the third epitaxial layer 112.

Figure 11:
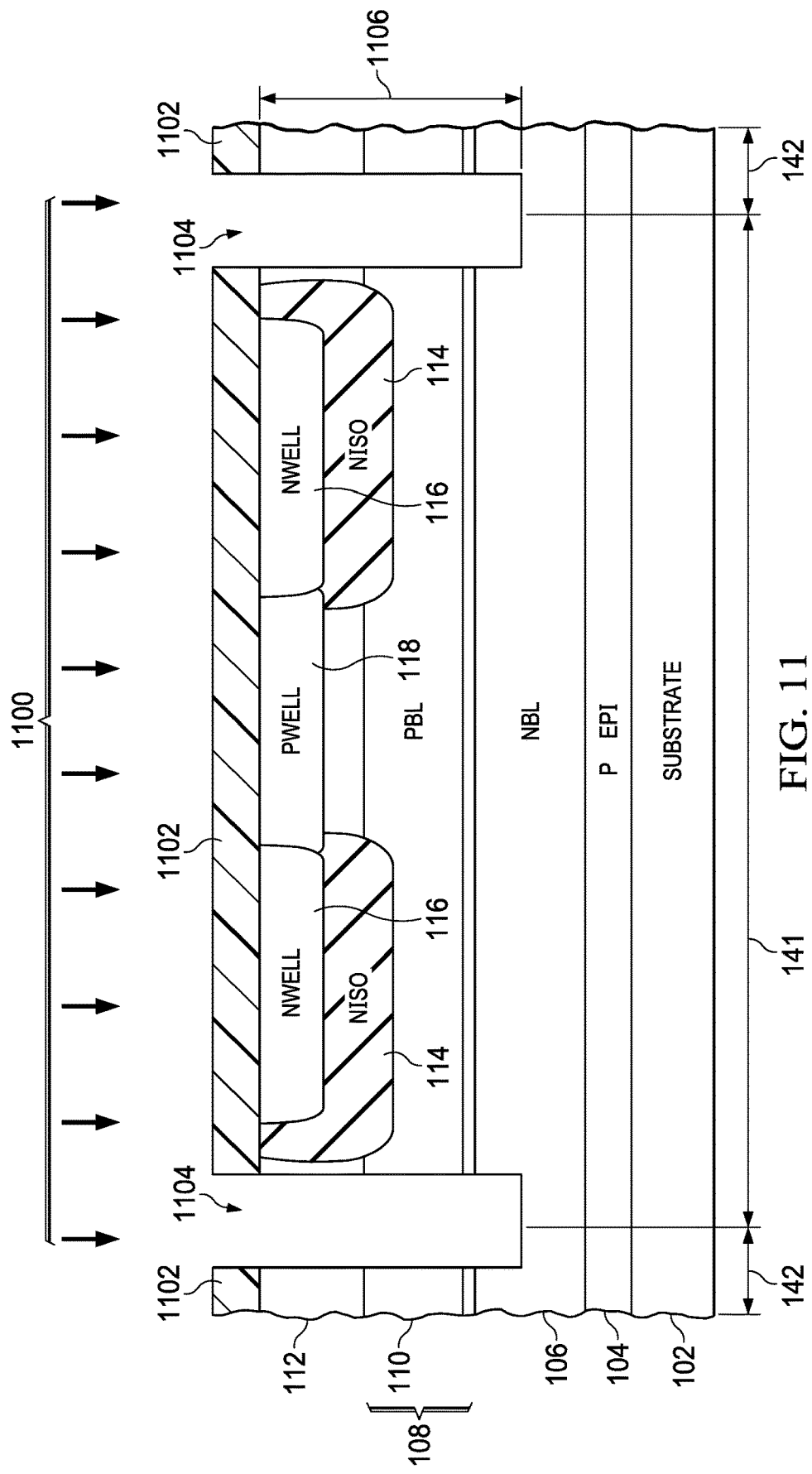
Figure 12:
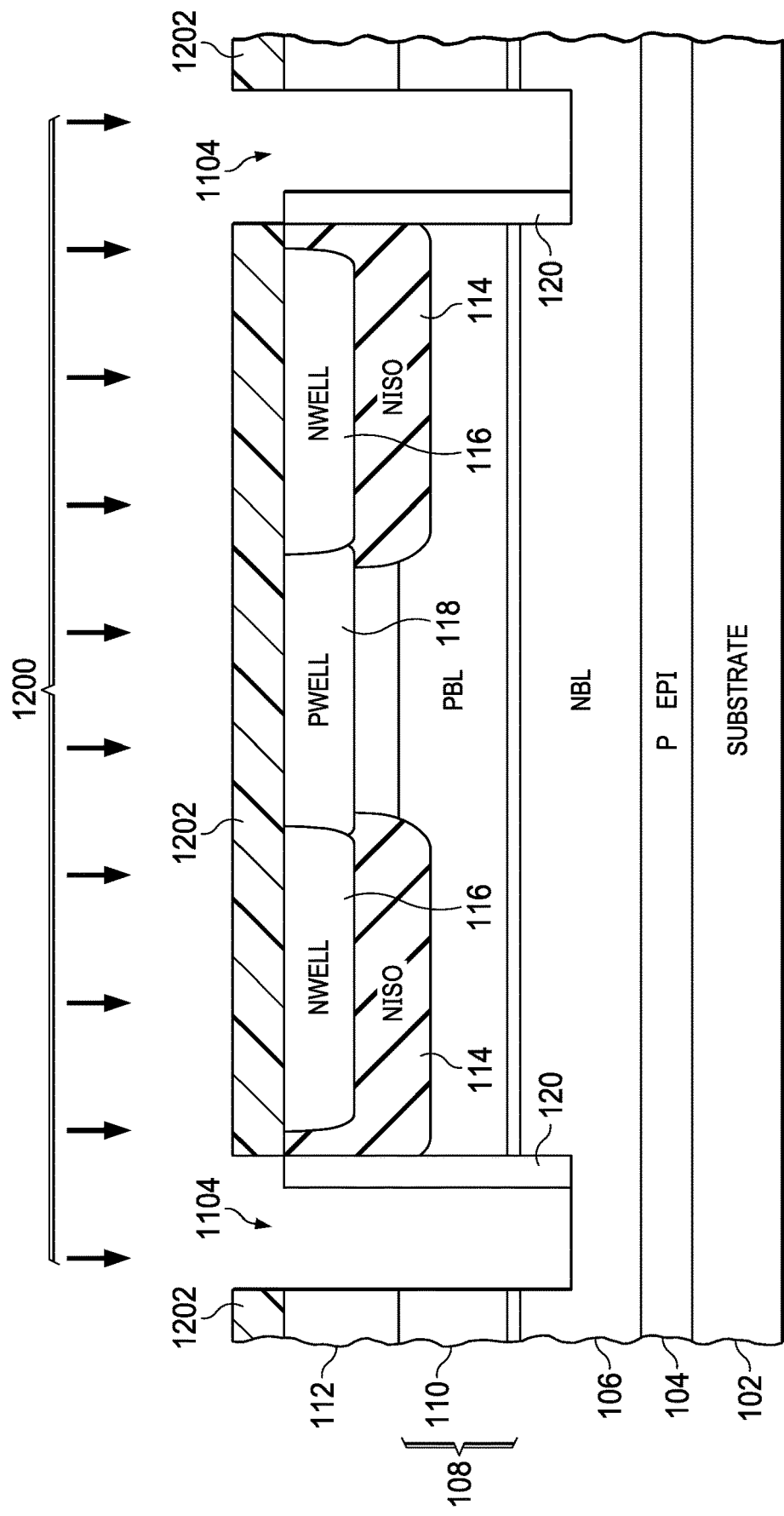
Figure 13:
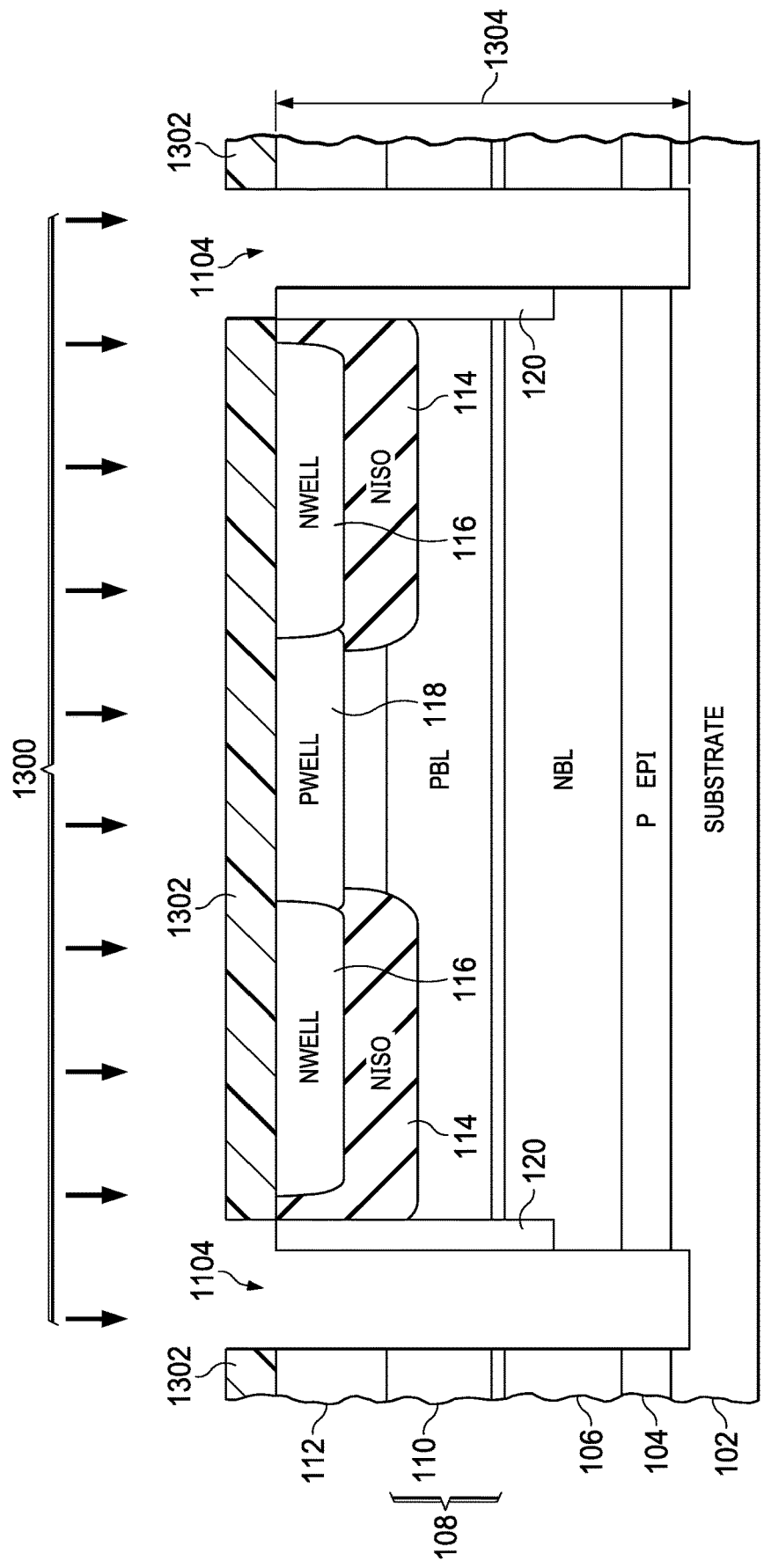
Figure 14:
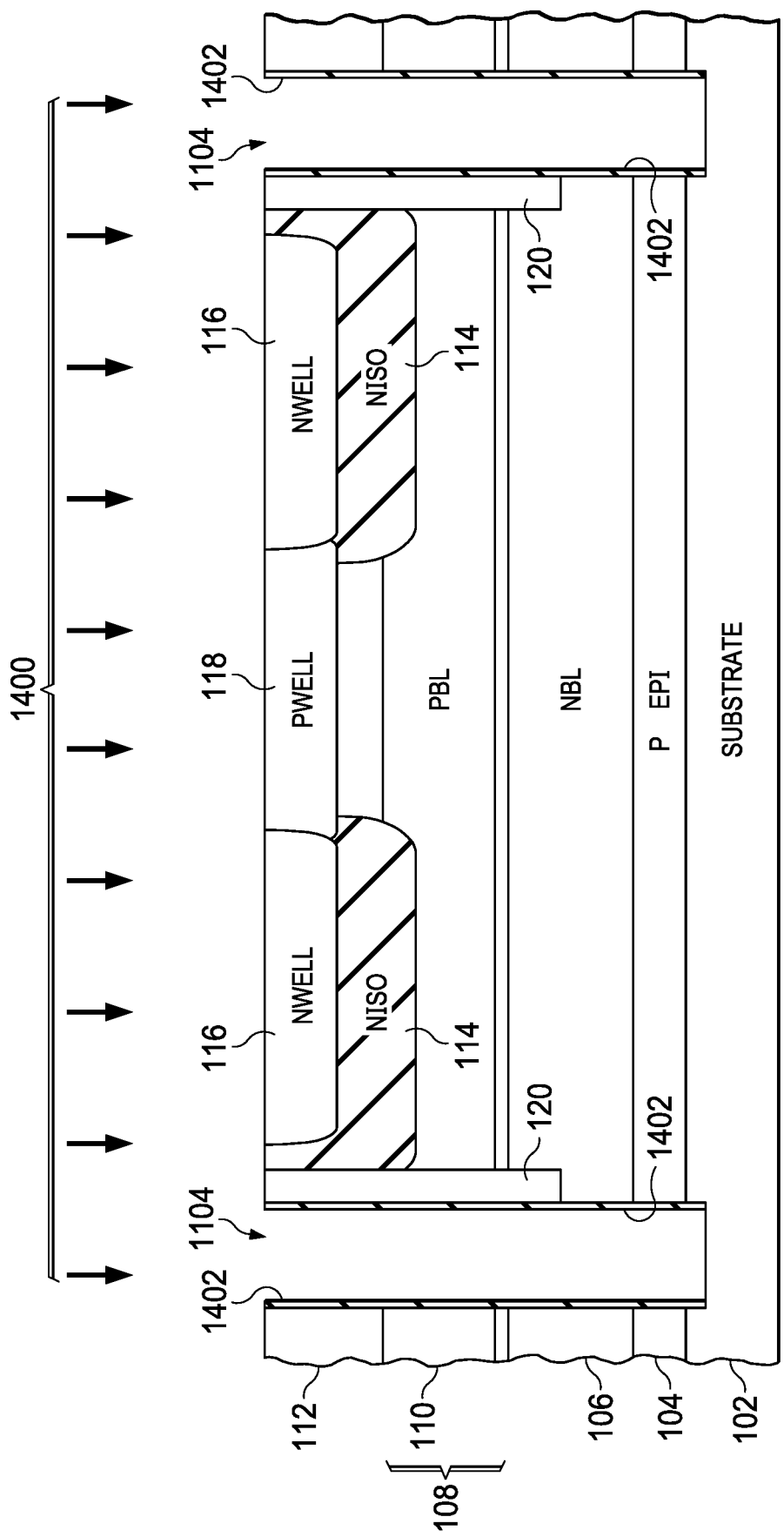
Figure 15:
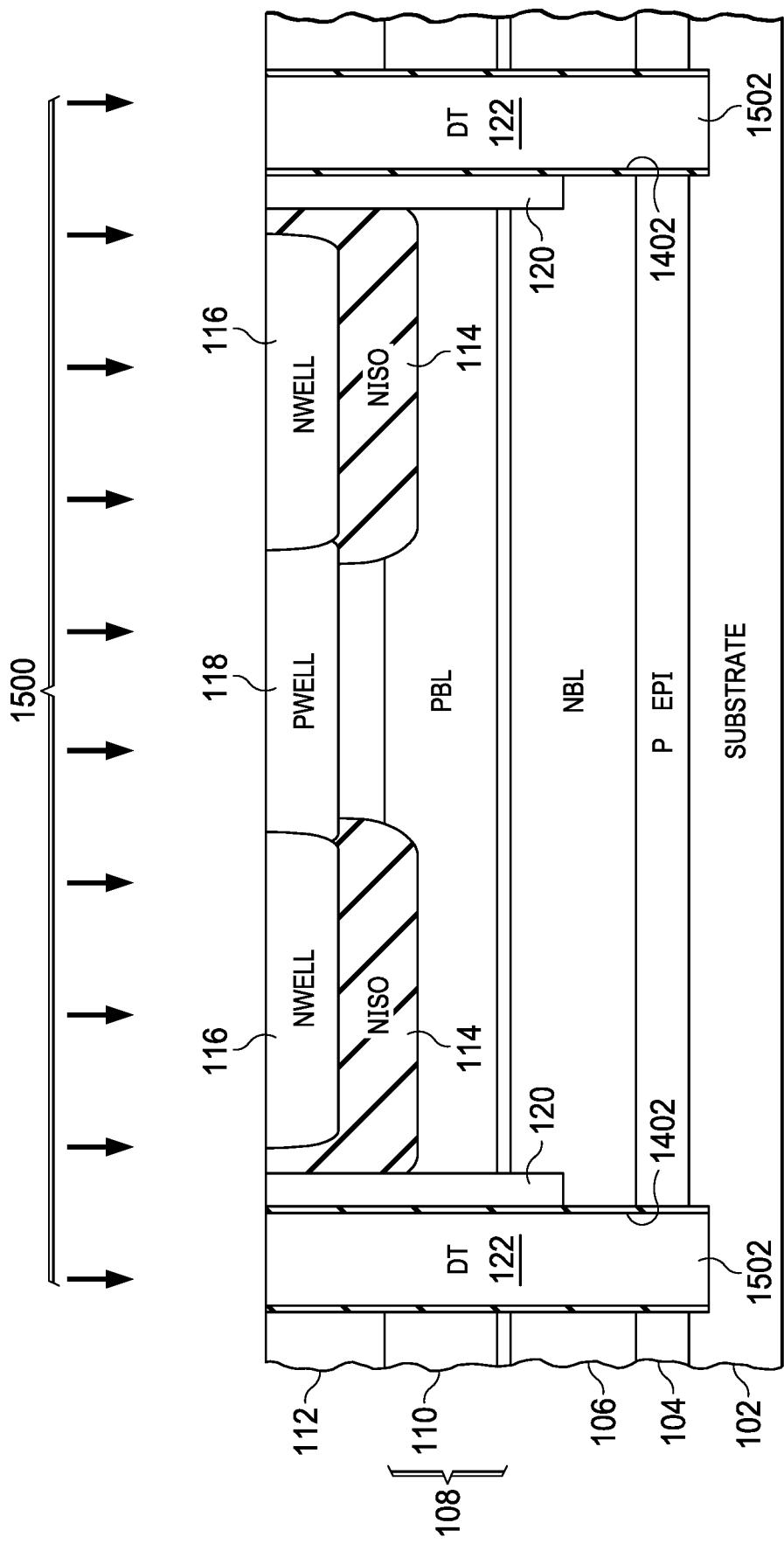

A deep trench isolation structure 122 is formed at 218-226 in FIG. 2, including p-type polysilicon and an oxide sidewall which extend through the epitaxial layers 104, 108, 112 and into the semiconductor substrate 102 to separate the first and second substrate regions 141 and 142. As shown in FIG. 11, a first deep trench (DT) etch process 1100 is used to etch a deep trench 1104 at 218 in FIG. 2 to a depth 1106 of approximately 13 µm in one example. Any suitable etch process 1100 can be used at 218, using a suitable etch mask 1102 as shown in FIG. 11. In this example, the etch process 1100 creates the partial deep trenches 1104 through the second and third epitaxial layers 108 and 112 and into the N buried layer 106 of the first epitaxial layer 104. At 220 in FIG. 2, a deep N implant is performed through the deep trench openings to create the deep N doped region 120 partially alongside the N isolation region 114 as shown in FIG. 12. This example uses an implantation process 1200 and a corresponding implant mask 1202 with an opening larger than the deep trench dimensions to form the deep N doped region 120 laterally surrounding the central portion of the first substrate region 141. In one example, the deep N doped region 120 is implanted with phosphorus or other N type dopants to a concentration of 1E17 to 1E18 cm$^{-3}$ using the process 1200 and the mask 1202. The deep trench formation continues at 222 in FIG. 2 with a second deep trench etch to reach the substrate 102. As shown in FIG. 13, a second trench etch mask 1302 is provided, and an etch process 1300 continues the removal of material to form an extended deep trench 1104 to a depth 1304 through the remainder of the first epitaxial layer 104 and into the substrate 102. At 224 in FIG. 2, a deep trench oxidation step is performed to create silicon dioxide (SiO$_2$) or other oxide material 1402 along the sidewalls of the trench 1104 using a process 1400. At 226 in FIG. 2, the trench is filled at 220 with polysilicon material 1502 as shown in FIG. 15.

Figure 16:
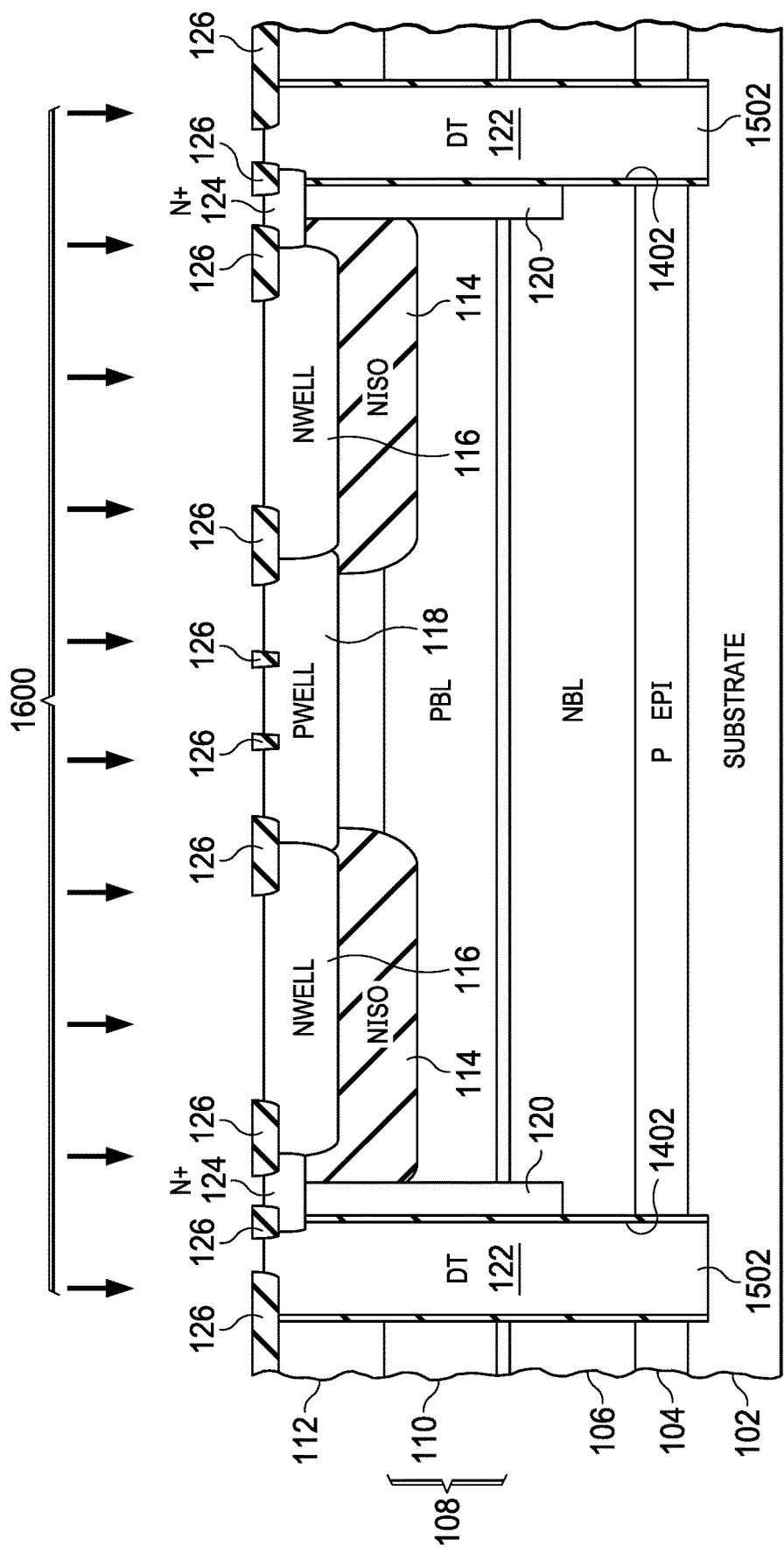
Figure 17:
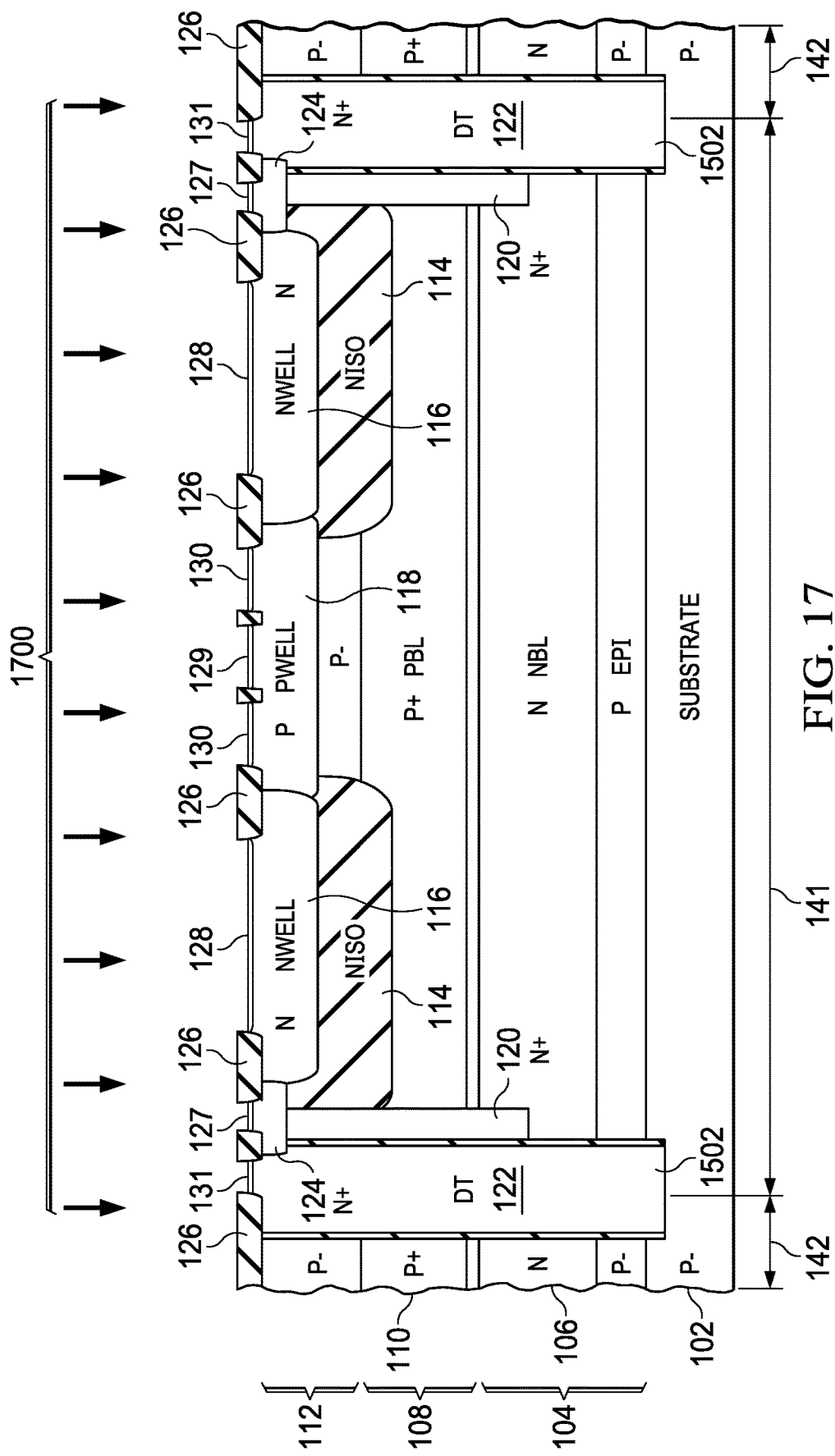

At 218 in FIG. 2, a shallow trench isolation (STI) process 1600 is performed to form the isolation structures 126 as shown in FIG. 16, and shallow doped regions are implanted via implantation processing 1700 in FIG. 17. The processing 1700 includes implanting n-type dopants into a select upper portion of the P doped region 118 to form the n-type emitter 129 of the NPN transistor 140, and concurrently implanting n-type dopants into an upper portion of the N doped region 116 to form the n-type collector 128 of the NPN transistor 140. In addition, the processing 1700 includes implanting p-type dopants into a different select portion of the upper portion of the P doped region 118 between the emitter 129 and the second side of the P doped region 118 to form the p-type base 130 of the NPN transistor 140. In addition, the illustrated example includes implanting n-type dopants into a select region of the upper portion of the third epitaxial layer 112 to form the n-type region 124 that extends between the N doped region 116 and the deep N doped region 120.

At 230 in FIG. 2, the CMOS transistor fabrication processing can be performed in certain examples, for instance, to fabricate CMOS transistors (not shown) in the second substrate region 142 of the IC 100. This processing can include forming a gate dielectric layer over the top surface of the epitaxial silicon layer 112, depositing a polysilicon layer, and performing a masked etch process to form the patterned gate structures over the gate dielectric layer, as well as forming sidewall spacers along the sidewalls of the patterned gates, and other associated processing (not shown).

Figure 18:
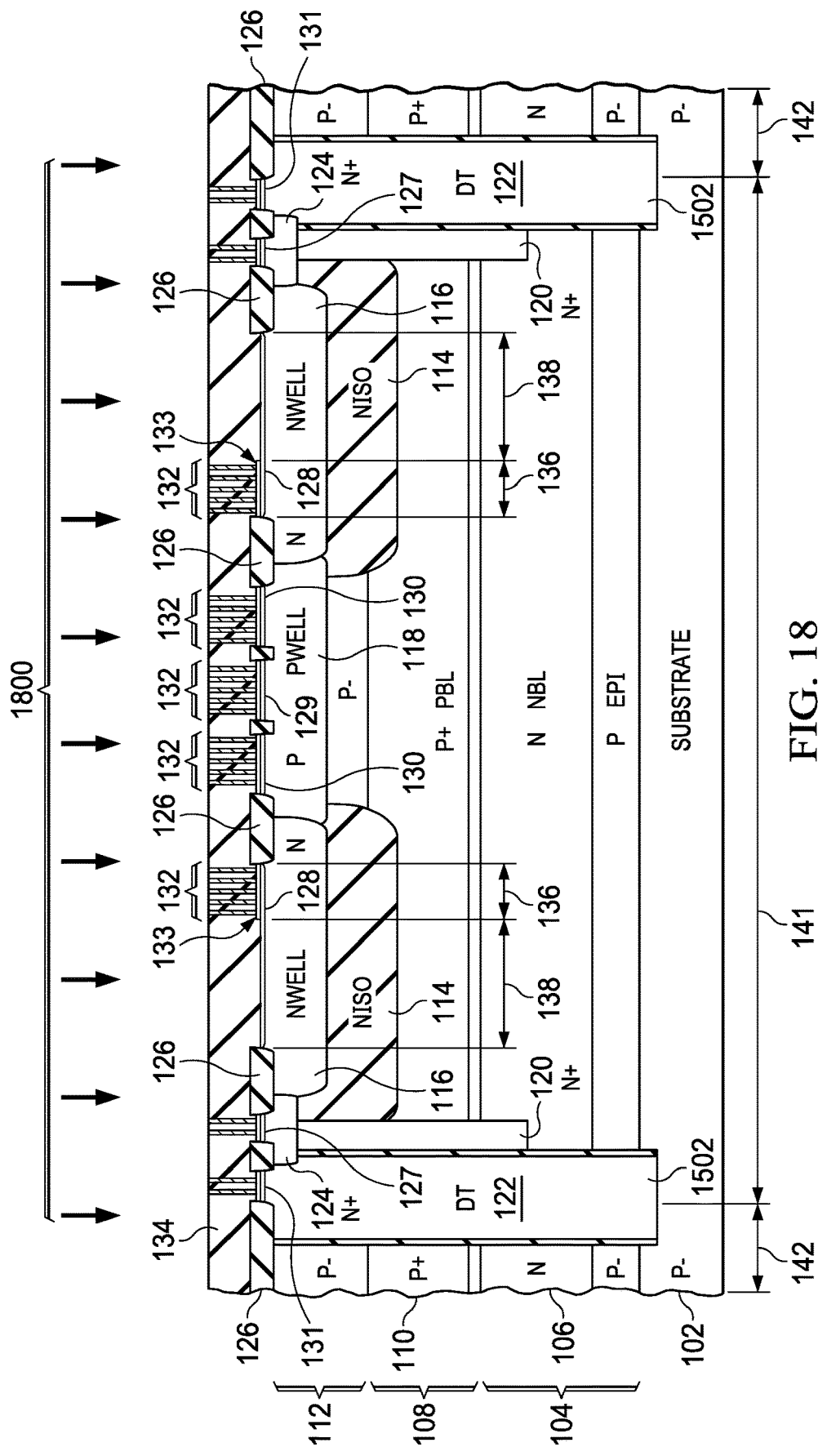

At 232 in FIG. 2, over portions of certain implanted regions on the upper surface of the third polysilicon layer 112 are selectively silicide and as shown in FIG. 18, including forming a conductive silicide collector contact 133 on the upper surface of a first collector portion 136 of the collector 128 spaced from the second side of the collector 128. In this example, silicide is also concurrently formed on the upper portions of the base 130 and the emitter 129 between the associated STI isolation structures 126. The processing at 232 provides conductive collector silicide contacts that are spaced from the deep N back side region 120 A PMD dielectric material layer 134, and the processing 1800 in FIG. 18 includes blocking silicide formation from the second portion 138 of the collector structure 128. The second portion 138 of the collector structure 128 is thereafter covered with the non-conductive PMD material 134 as shown in FIG. 18. In this manner, the second portion 138 of the collector 128 provides back side ballast or impedance in order to provide controlled voltage drop for controlled lateral breakdown of the resulting NPN transistor 140 during operation to initially conduct current laterally, and thereafter to provide vertical as well as lateral conduction for controlled holding voltage. The structure provides advantageous predictable conduction for a variety of uses, including without limitation operation of the resulting NPN transistor 140 as a protection transistor to selectively discharge a protected node in response to ESD events in the IC 100. The Metallization and other back and processing is performed at 234 in FIG. 2 in order to complete the fabrication of the IC 100, including forming one or more further interlayer or interlevel dielectric (ILD) layers and associated conductive interconnection structures to provide a single or multi-layer metallization structure 144 as illustrated in FIG. 1 hereinabove.

Figure 19:
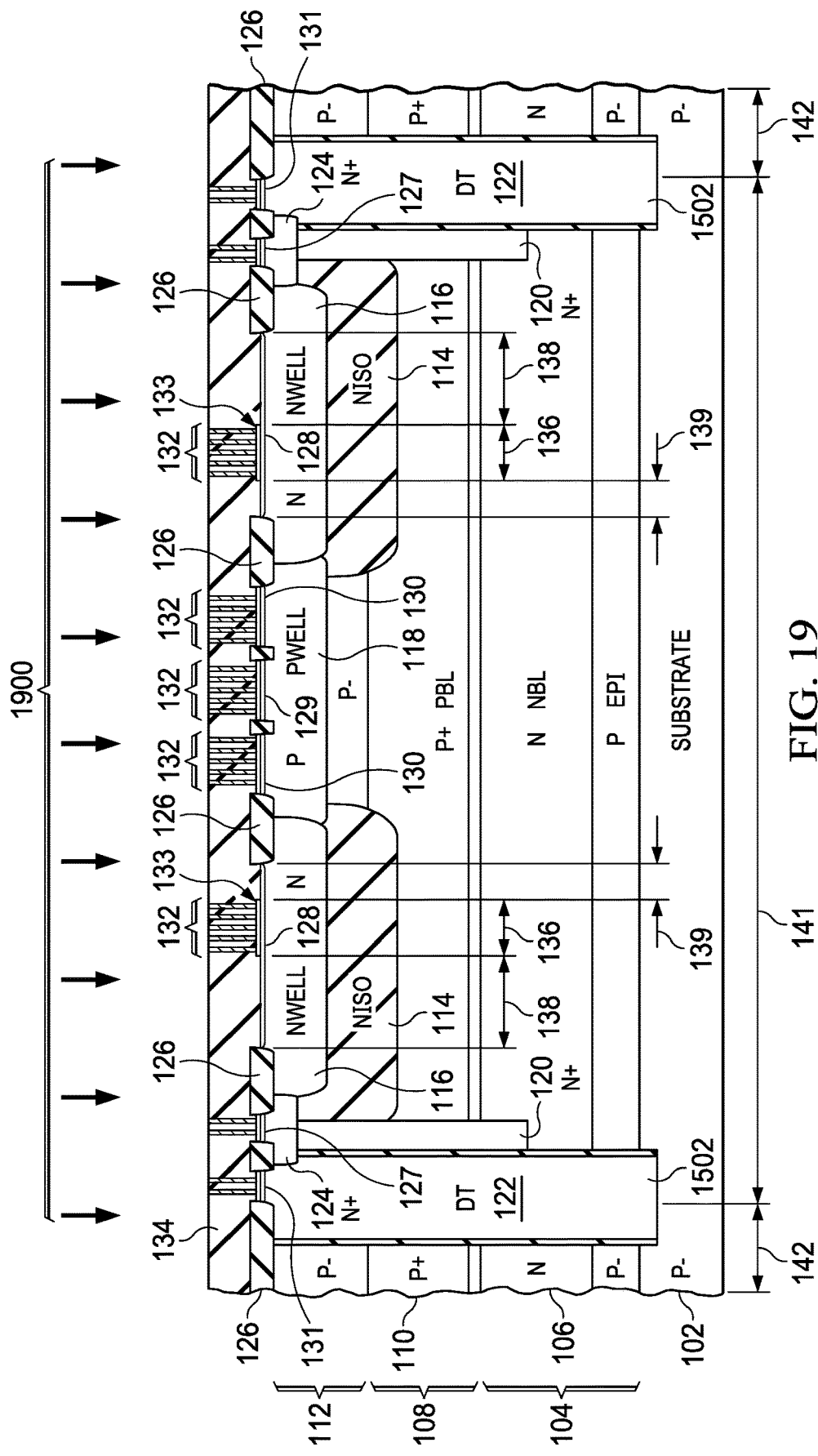
FIGS. 19 and 20 are partial sectional side elevation views of an integrated circuit with a back and front ballasted vertical NPN bipolar transistor ESD protection circuit according to another embodiment.
Figure 20:
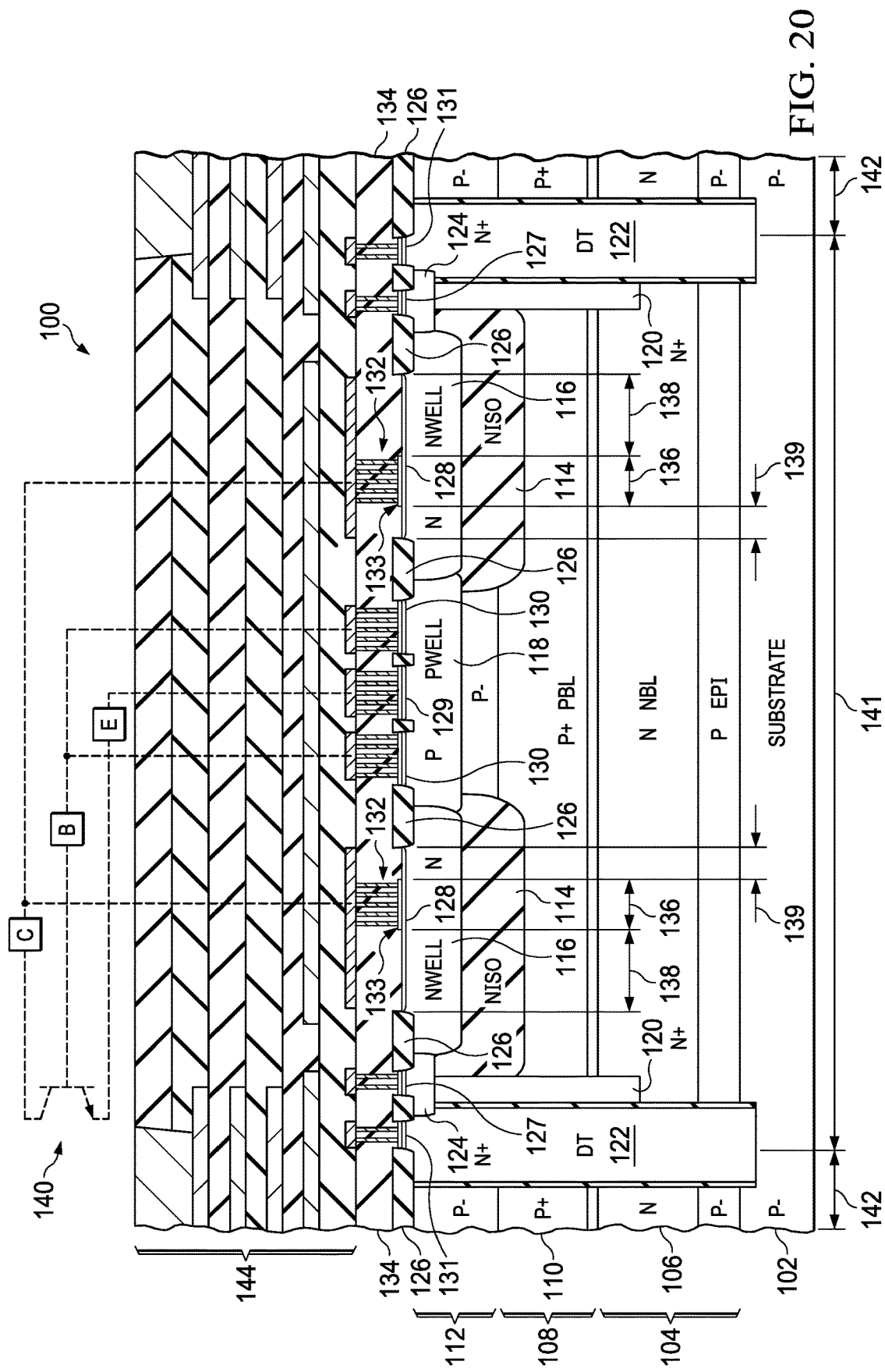

FIGS. 19 and 20 another non-limiting example in which the non-conductive dielectric 134 (PMD) on an upper surface of the third collector portion 139 that extends laterally between the first collector portion 136 and the first side of the collector 128. This structure provides both back and front side ballast and of the collector of the NPN transistor 140.

Figure 21:
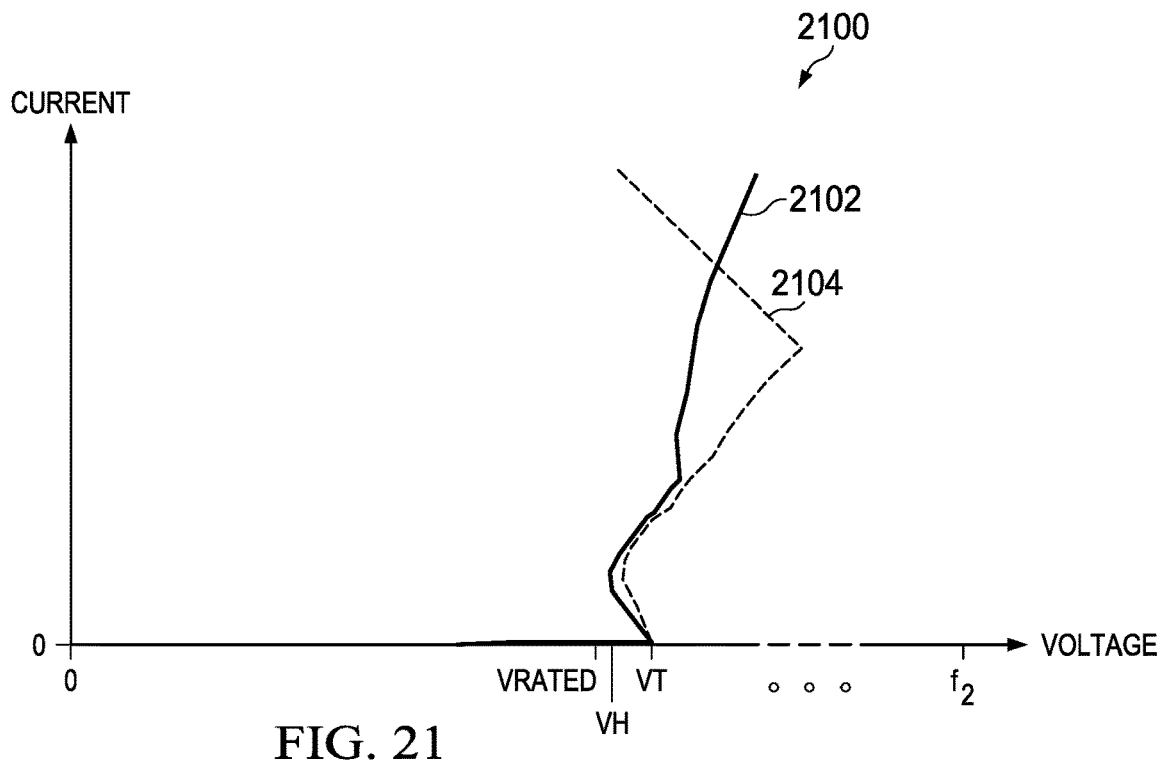
FIG. 21 is a graph of comparative TLP current-voltage (IV) curves for the back ballasted transistor design of FIG. 1 and a non-ballasted vertical NPN transistor.

FIG. 21 shows a graph 2100 that illustrates an example transmission line pulsing (TLP) current-voltage (IV) curve 2102 for the illustrated back-ballasted vertical NPN transistor 140 in FIG. 1 hereinabove during operation as an ESD protection transistor in the IC 100, along with a comparative TLP curve 2104 for a non-back-ballasted NPN transistor. As shown in the graph 2100, the back-ballasted transistor device 140 provides controlled discharge current for protection during an ESD event when the voltage reaches a trigger voltage VT, and better control of the holding voltage VH thereafter through an initial breakdown current conduction laterally in the device (e.g., path 151) of FIG. 1, and thereafter controlled vertical breakdown compared with the performance curve 2104. This allows the use of the back-ballasted transistor design 140 in an integrated circuit 100 to provide any desired level of protection for a protected node having a rated voltage level VRATED.

Figure 22:
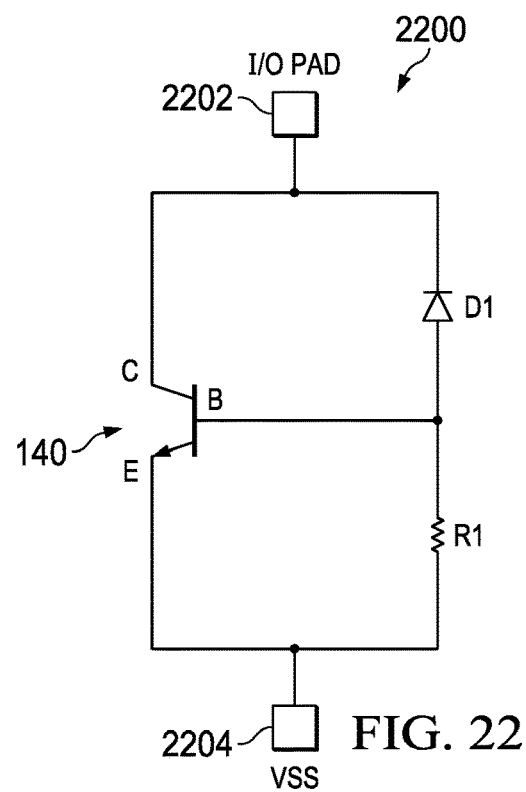
FIG. 22 is a schematic diagram of an ESD protection circuit of FIG. 1 with the back ballasted vertical NPN bipolar transistor of FIG. 1 connected between a reference node and a protected node.

FIG. 22 shows an ESD protection circuit 2200 including the back ballasted vertical NPN bipolar transistor 140 of FIG. 1 connected between a protected node 2202 (e.g., an I/O pad) and a reference node 2204 (e.g., a supply voltage or reference voltage node VSS). A diode D1 is connected between the base control terminal B of the NPN transistor 140 and the protected node 2202. A resistor R1 is connected between the base control terminal B and the reference node 2204. In operation at normal signal levels of the protected node 2202, the diode D1 is reverse biased, and no current flows in the resistor R1. As a result, the control terminal voltage at the base B is at the voltage (VSS) of the reference node 2204, and the protection transistor 140 is turned off. In this condition, host circuitry (not shown) of the associated integrated circuit 100 can apply or receive signal level voltages at the I/O pad 2202, and the protection circuit 140 does not interfere with normal operation of the host circuit. During an ESD event that raises the I/O pad voltage at the protected node 2202 above the trigger voltage of the transistor 140, the diode D1 breaks down, causing current flow in the resistor R1. This raises the base control voltage of the protection transistor 140, which turns on to safely discharge the protected node 2202.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:
1. An integrated circuit (IC), comprising:
   a semiconductor structure;
   an N doped layer positioned in a middle portion of the semiconductor structure;
   a P doped layer positioned above the N doped layer in the semiconductor structure;

an N doped region positioned in an upper portion of the semiconductor structure, the N doped region including a first side and a second side;

a P doped region positioned in the upper portion of the semiconductor structure, the P doped region including a first side, and a second side along the first side of the N doped region a deep N doped region electrically connected to the second side of the N doped region, the deep N doped region extending from the upper portion of the semiconductor structure downward through the P doped layer and into the N-doped layer; and an NPN bipolar transistor, including: an n-type emitter positioned in an upper portion of the P doped region; a p-type base laterally spaced from the emitter in the upper portion of the P doped region between the emitter and the second side of the P doped region; and an n-type collector laterally spaced from the base in an upper portion of the N doped region, the collector including a first collector portion, a second collector portion positioned between the first collector portion and the deep N doped region, a dielectric isolation structure located between the second collector portion and the deep N doped region, a conductive silicide collector contact positioned on an upper surface of the first collector portion, and a non-conductive dielectric formed separately from the dielectric isolation structure and positioned on an upper surface of the second collector portion.

2. The IC of claim 1, further comprising an n-type isolation region positioned under the N doped region, the n-type isolation region including a side that extends along an upper portion of the deep N doped region.

3. The IC of claim 2, wherein the semiconductor structure includes:
a p-type semiconductor substrate; and
a p-type epitaxial silicon structure disposed over the semiconductor substrate, the epitaxial silicon structure including:
a p-type first epitaxial layer positioned above the semiconductor substrate, including the N doped layer positioned in an upper portion of the first epitaxial layer,
a p-type second epitaxial layer positioned above the first epitaxial layer, the second epitaxial layer including the P doped layer positioned in an upper portion of the second epitaxial layer, and
a p-type third epitaxial layer positioned above the second epitaxial layer, the third epitaxial layer including the emitter, the base and the collector.

4. The IC of claim 3, wherein the collector further includes a third collector portion positioned between the first collector portion and the base, and wherein the non-conductive dielectric is positioned on an upper surface of the third collector portion.

5. The IC of claim 4, further comprising a deep trench structure including p-type polysilicon and an oxide sidewall that separates first and second substrate regions of the semiconductor structure, wherein the transistor is positioned in the first substrate region, and wherein the deep N doped region extends from the upper portion of the semiconductor structure downward through the P doped layer and into the N doped layer along the oxide sidewall of the deep trench structure.

6. The IC of claim 5, further comprising an n-type region that extends in the upper portion of the semiconductor structure between the N doped region and the deep N doped region.

7. The IC of claim 1, wherein the semiconductor structure includes:
a p-type semiconductor substrate; and
a p-type epitaxial silicon structure disposed over the semiconductor substrate, the epitaxial silicon structure including:
a p-type first epitaxial layer positioned above the semiconductor substrate, including the N doped layer positioned in an upper portion of the first epitaxial layer;
a p-type second epitaxial layer positioned above the first epitaxial layer, the second epitaxial layer including the P doped layer positioned in an upper portion of the second epitaxial layer; and
a p-type third epitaxial layer positioned above the second epitaxial layer, the third epitaxial layer including the emitter, the base and the collector.

8. The IC of claim 1, wherein the collector further includes a third collector portion positioned between the first collector portion and the base, and wherein the non-conductive dielectric is positioned on an upper surface of the third collector portion.

9. The IC of claim 1, further comprising a deep trench structure including p-type polysilicon and an oxide sidewall that separates first and second substrate regions of the semiconductor structure, wherein the transistor is positioned in the first substrate region, and wherein the deep N doped region extends from the upper portion of the epitaxial silicon structure downward through the P doped layer and into the N doped layer along the oxide sidewall of the deep trench structure.

10. The IC of claim 1, further comprising an n-type region that extends in the upper portion of the semiconductor structure between the N doped region and the deep N doped region.

11. A back-ballasted NPN bipolar transistor, including:
an n-type emitter positioned in an upper portion of a P doped region that has laterally spaced first and second sides;
a p-type base laterally spaced from the emitter in the upper portion of the P doped region between the emitter and the second side of the P doped region, the base including a first side facing the emitter, and an opposite second side; and
an n-type collector laterally spaced from the second side of the base in an upper portion of an N doped region, the collector including a first side facing the second side of the base, an opposite second side, a first collector portion, a second collector portion that extends laterally between the first collector portion and the second side of the collector, a conductive silicide collector contact positioned on an upper surface of the first collector portion, the silicide collector contact being spaced from the second side of the collector, a non-conductive dielectric positioned on an upper surface of the second collector portion, and a dielectric isolation structure formed separately from the non-conductive dielectric and abutting the second side of the collector and the non-conductive dielectric.

12. The transistor of claim 11, wherein the collector further includes a deep N doped region which is electrically connected to the second side of the N doped region and which extends vertically into an N doped layer.

13. The transistor of claim 12, further comprising an n-type region that extends between the N doped region and the deep N doped region.

14. The transistor of claim 12, further comprising an n-type isolation region positioned under the N doped region and partially under the P doped region, the isolation region including a side that extends along an upper portion of the deep N doped region.

15. The transistor of claim 11, wherein the collector further includes a third collector portion positioned laterally between the first collector portion and the first side of the collector, and wherein the non-conductive dielectric is positioned on an upper surface of the third collector portion.

16. An integrated circuit (IC), comprising:
a semiconductor structure;
an N doped layer positioned in a middle portion of the semiconductor structure;
a P doped layer positioned above the N doped layer in the semiconductor structure;
an N doped region positioned in an upper portion of the semiconductor structure, the N doped region including a first side and a second side;
a P doped region positioned in the upper portion of the semiconductor structure, the P doped region including a first side, and a second side along the first side of the N doped region
a deep N doped region electrically connected to the second side of the N doped region, the deep N doped region extending from the upper portion of the semiconductor structure downward through the P doped layer and into the N-doped layer;
an NPN bipolar transistor, including: an n-type emitter positioned in an upper portion of the P doped region; a p-type base laterally spaced from the emitter in the upper portion of the P doped region between the emitter and the second side of the P doped region; and an n-type collector laterally spaced from the base in an upper portion of the N doped region, the collector including a first collector portion, a second collector portion positioned between the first collector portion and the deep N doped region, a conductive silicide collector contact positioned on an upper surface of the first collector portion, and a non-conductive dielectric positioned on an upper surface of the second collector portion; and
an n-type isolation region positioned under the N doped region and partially under the P doped layer, the n-type isolation region including a side that extends along an upper portion of the deep N doped region.

17. The IC of claim 16, wherein the semiconductor structure includes:
a p-type semiconductor substrate; and
a p-type epitaxial silicon structure disposed over the semiconductor substrate, the epitaxial silicon structure including:
a p-type first epitaxial layer positioned above the semiconductor substrate, including the N doped layer positioned in an upper portion of the first epitaxial layer,
a p-type second epitaxial layer positioned above the first epitaxial layer, the second epitaxial layer including the P doped layer positioned in an upper portion of the second epitaxial layer, and
a p-type third epitaxial layer positioned above the second epitaxial layer, the third epitaxial layer including the emitter, the base and the collector.

18. The IC of claim 16, wherein the semiconductor structure includes:
a p-type semiconductor substrate; and
a p-type epitaxial silicon structure disposed over the semiconductor substrate, the epitaxial silicon structure including:
a p-type first epitaxial layer positioned above the semiconductor substrate, including the N doped layer positioned in an upper portion of the first epitaxial layer;
a p-type second epitaxial layer positioned above the first epitaxial layer, the second epitaxial layer including the P doped layer positioned in an upper portion of the second epitaxial layer; and
a p-type third epitaxial layer positioned above the second epitaxial layer, the third epitaxial layer including the emitter, the base and the collector.

19. The IC of claim 16, wherein the collector further includes a third collector portion positioned between the first collector portion and the base, and wherein the non-conductive dielectric is positioned on an upper surface of the third collector portion.

20. The IC of claim 16, further comprising a deep trench structure including p-type polysilicon and an oxide sidewall that separates first and second substrate regions of the semiconductor structure, wherein the transistor is positioned in the first substrate region, and wherein the deep N doped region extends from the upper portion of the epitaxial silicon structure downward through the P doped layer and into the N doped layer along the oxide sidewall of the deep trench structure.

* * * * *